United States Patent
Donofrio et al.

(10) Patent No.: US 10,658,546 B2
(45) Date of Patent: May 19, 2020

(54) HIGH EFFICIENCY LEDS AND METHODS OF MANUFACTURING

(71) Applicant: CREE, INC., Durham, NC (US)

(72) Inventors: Matthew Donofrio, Raleigh, NC (US); Pritish Kar, Cary, NC (US); Sten Heikman, Goleta, CA (US); Harshad Golakia, Morrisville, NC (US); Rajeev Acharya, Santa Barbara, CA (US); Yuvaraj Dora, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/602,040

(22) Filed: Jan. 21, 2015

(65) Prior Publication Data

US 2016/0211420 A1 Jul. 21, 2016

(51) Int. Cl.
*H01L 33/46* (2010.01)
*H01L 33/14* (2010.01)
(Continued)

(52) U.S. Cl.
CPC .......... *H01L 33/46* (2013.01); *H01L 33/0095* (2013.01); *H01L 33/14* (2013.01);
(Continued)

(58) Field of Classification Search
CPC ..... H01L 33/0095; H01L 33/14; H01L 33/38; H01L 33/46; H01L 2933/0016;
(Continued)

(56) References Cited

U.S. PATENT DOCUMENTS 1,393,573 A 10/1921 Ritter ........................... 362/509
1,880,399 A 10/1932 Benjamin .................... 362/277
(Continued)

FOREIGN PATENT DOCUMENTS

CN 1841183 A 10/2006
CN 1957481 5/2007
(Continued)

OTHER PUBLICATIONS

U.S. Appl. No. 13/168,689, filed Jun. 24, 2011, Bergman, et al.
(Continued)

*Primary Examiner* — Tuan A Hoang
(74) *Attorney, Agent, or Firm* — Ferguson Case Orr Paterson LLP

(57) ABSTRACT

Simplified LED chip architectures or chip builds are disclosed that can result in simpler manufacturing processes using fewer steps. The LED structure can have fewer layers than conventional LED chips with the layers arranged in different ways for efficient fabrication and operation. The LED chips can comprise an active LED structure. A dielectric reflective layer is included adjacent to one of the oppositely doped layers. A metal reflective layer is on the dielectric reflective layer, wherein the dielectric and metal reflective layers extend beyond the edge of said active region. By extending the dielectric layer, the LED chips can emit with more efficiency by reflecting more LED light to emit in the desired direction. By extending the metal reflective layer beyond the edge of the active region, the metal reflective layer can serve as a current spreading layer and barrier, in addition to reflecting LED light to emit in the desired direction. The LED chips can also comprise self-aligned and self-limiting features that simplify etching processes during fabrication.

48 Claims, 6 Drawing Sheets

(51) Int. Cl.
*H01L 33/38* (2010.01)
*H01L 33/00* (2010.01)
*H01L 33/42* (2010.01)

(52) U.S. Cl.
CPC .............. *H01L 33/38* (2013.01); *H01L 33/42* (2013.01); *H01L 2933/0016* (2013.01); *H01L 2933/0025* (2013.01)

(58) Field of Classification Search
CPC ............. H01L 2933/0025; H01L 33/42; H01L 33/405; H01L 33/145; H01L 27/156
USPC ............ 257/40, 98, 99, 91, E33.068; 438/29
See application file for complete search history.

(56) References Cited

U.S. PATENT DOCUMENTS

| | | | |
|---|---|---|---|
| 2,214,600 A | 9/1940 | Winkler | 362/279 |
| 2,981,827 A | 4/1961 | Orsatta | 362/84 |
| 2,981,927 A | 4/1961 | Orsatti et al. | |
| 3,395,272 A | 7/1968 | Nicholl | 362/305 |
| 4,420,800 A | 12/1983 | Van Horn | 362/297 |
| 4,946,547 A | 8/1990 | Palmour et al. | |
| 5,018,157 A | 5/1991 | Deppe et al. | 372/45.013 |
| 5,200,022 A | 4/1993 | Kong et al. | |
| RE34,861 E | 2/1995 | Davis et al. | |
| 5,768,339 A | 6/1998 | O'Hara | 378/147 |
| 5,912,915 A | 6/1999 | Reed et al. | 372/93 |
| 6,055,261 A | 4/2000 | Reed et al. | |
| 6,076,948 A | 6/2000 | Bukosky et al. | |
| 6,111,276 A | 8/2000 | Mauk | 257/98 |
| 6,149,283 A | 11/2000 | Conway et al. | |
| 6,409,361 B1 | 6/2002 | Ikeda | 362/240 |
| 6,454,439 B1 | 9/2002 | Camarota | 362/293 |
| 6,459,713 B2 | 10/2002 | Jewell | 372/46 |
| 6,558,032 B2 | 5/2003 | Kondo et al. | 362/516 |
| 6,585,397 B1 | 7/2003 | Ebiko | 362/297 |
| 6,603,151 B2 | 8/2003 | Lin et al. | 257/98 |
| 6,643,305 B2 | 11/2003 | Bewley et al. | 372/45.01 |
| 6,657,236 B1 | 12/2003 | Thibeault et al. | 257/98 |
| 6,758,582 B1 | 7/2004 | Hsiao et al. | |
| 6,784,462 B2 | 8/2004 | Schubert | 257/98 |
| 6,793,373 B2 | 9/2004 | Matsuba et al. | 362/260 |
| 6,797,987 B2 | 9/2004 | Chen | 257/98 |
| 6,812,502 B1 | 11/2004 | Chien et al. | 257/99 |
| 6,817,737 B2 | 11/2004 | Romano et al. | 362/293 |
| 6,840,652 B1 | 1/2005 | Hymer | |
| 6,851,834 B2 | 2/2005 | Leysath | 362/303 |
| 6,986,594 B2 | 1/2006 | Wirth et al. | |
| 6,995,402 B2 | 2/2006 | Ludowise et al. | 257/91 |
| 7,121,690 B1 | 10/2006 | Ramer et al. | 362/297 |
| 7,213,940 B1 | 5/2007 | Van de Ven et al. | 362/231 |
| 7,221,044 B2 | 5/2007 | Fan et al. | 257/676 |
| 7,321,126 B2 | 1/2008 | Singer et al. | 250/492 |
| 7,332,365 B2 | 2/2008 | Nakamura et al. | |
| 7,339,965 B2 | 3/2008 | Ledentsov et al. | 372/45 |
| 7,573,074 B2 | 8/2009 | Shum et al. | 257/99 |
| 7,607,808 B2 | 10/2009 | Birman et al. | 362/489 |
| 7,622,746 B1 * | 11/2009 | Lester | H01L 33/46 257/98 |
| 7,638,810 B2 | 12/2009 | Bour et al. | 257/98 |
| 7,784,977 B2 | 8/2010 | Moolman et al. | 362/298 |
| 7,795,623 B2 | 9/2010 | Emerson et al. | 257/79 |
| 7,821,023 B2 | 10/2010 | Yuan et al. | 257/98 |
| 7,915,629 B2 | 3/2011 | Ibbetson et al. | 257/98 |
| 7,985,970 B2 | 7/2011 | Ibbetson et al. | |
| 8,118,451 B2 | 2/2012 | Householder et al. | 362/277 |
| 8,212,273 B2 | 7/2012 | McKenzie et al. | |
| 8,235,541 B2 | 8/2012 | Chen | 362/97 |
| 8,324,652 B1 | 12/2012 | Lester et al. | |
| 8,368,100 B2 * | 2/2013 | Donofrio | H01L 33/405 257/79 |
| 8,431,423 B2 | 4/2013 | Basin et al. | 438/26 |
| 8,492,785 B2 | 7/2013 | Hodota | 257/98 |
| 8,791,471 B2 | 7/2014 | Leung | 257/88 |

| | | | |
|---|---|---|---|
| 2003/0025212 A1 | 2/2003 | Bhat et al. | |
| 2003/0210550 A1 | 11/2003 | Matsuba et al. | |
| 2004/0085463 A1 | 5/2004 | Sharma | |
| 2004/0155565 A1 | 8/2004 | Holder et al. | |
| 2004/0217362 A1 | 11/2004 | Slater et al. | |
| 2005/0063061 A1 | 3/2005 | Grawert et al. | 359/586 |
| 2005/0168994 A1 | 8/2005 | Jacobson et al. | 362/311 |
| 2005/0211993 A1 | 9/2005 | Sano et al. | 257/79 |
| 2005/0225222 A1 | 10/2005 | Mazzochette et al. | 313/46 |
| 2005/0242358 A1 | 11/2005 | Tu et al. | 257/98 |
| 2006/0039009 A1 | 2/2006 | Kiesel et al. | 356/519 |
| 2006/0049411 A1 | 3/2006 | Nakamura et al. | |
| 2006/0060874 A1 | 3/2006 | Edmond et al. | 257/98 |
| 2006/0076568 A1 | 4/2006 | Keller et al. | 257/98 |
| 2006/0163586 A1 | 7/2006 | Denbaars et al. | |
| 2006/0163589 A1 | 7/2006 | Fan et al. | 257/88 |
| 2006/0273335 A1 * | 12/2006 | Asahara | H01L 33/405 257/98 |
| 2006/0274805 A1 | 12/2006 | Song et al. | |
| 2006/0278885 A1 | 12/2006 | Tain et al. | |
| 2007/0057270 A1 | 3/2007 | Bour et al. | 257/99 |
| 2007/0057273 A1 | 3/2007 | Yoo | 257/99 |
| 2007/0139923 A1 | 6/2007 | Negley | |
| 2007/0145380 A1 | 6/2007 | Shum et al. | |
| 2007/0158668 A1 | 7/2007 | Tarsa et al. | 257/79 |
| 2007/0217193 A1 | 9/2007 | Lin | |
| 2007/0217200 A1 | 9/2007 | Yang et al. | 362/277 |
| 2007/0236626 A1 | 10/2007 | Koganezawa | |
| 2008/0035949 A1 | 2/2008 | Fudeta et al. | 257/99 |
| 2008/0061304 A1 | 3/2008 | Huang et al. | |
| 2008/0123341 A1 | 5/2008 | Chiu | 362/294 |
| 2008/0144688 A1 | 6/2008 | Chua et al. | |
| 2008/0173884 A1 | 7/2008 | Chitnis et al. | 438/22 |
| 2008/0179611 A1 | 7/2008 | Chitnis et al. | 257/98 |
| 2008/0185609 A1 | 8/2008 | Kozawa et al. | 257/99 |
| 2008/0191233 A1 | 8/2008 | Yang et al. | |
| 2008/0265268 A1 | 10/2008 | Braune et al. | 257/98 |
| 2008/0272391 A1 | 11/2008 | Kapur et al. | |
| 2008/0310158 A1 | 12/2008 | Harbers et al. | 362/294 |
| 2009/0026478 A1 | 1/2009 | Yoon et al. | 257/98 |
| 2009/0029495 A1 | 1/2009 | Li et al. | 438/29 |
| 2009/0039371 A1 | 2/2009 | Kim | |
| 2009/0050908 A1 | 2/2009 | Yuan et al. | 257/88 |
| 2009/0103293 A1 | 4/2009 | Harbers et al. | 362/231 |
| 2009/0121241 A1 | 5/2009 | Keller et al. | 257/94 |
| 2009/0152583 A1 | 6/2009 | Chen et al. | 257/98 |
| 2009/0161356 A1 | 6/2009 | Negley et al. | 362/231 |
| 2009/0161367 A1 | 6/2009 | Vanden Eynden | 362/297 |
| 2009/0213591 A1 | 8/2009 | Katabe et al. | 362/236 |
| 2009/0231856 A1 | 9/2009 | Householder | |
| 2009/0283779 A1 | 11/2009 | Negley et al. | 257/88 |
| 2009/0283787 A1 | 11/2009 | Donofrio et al. | 257/98 |
| 2009/0323334 A1 | 12/2009 | Roberts et al. | 362/247 |
| 2010/0001299 A1 | 1/2010 | Chang et al. | 257/89 |
| 2010/0012962 A1 | 1/2010 | Hong et al. | |
| 2010/0029023 A1 | 2/2010 | Neff et al. | 438/15 |
| 2010/0033655 A1 | 2/2010 | Nakamoto | |
| 2010/0038659 A1 | 2/2010 | Chen et al. | |
| 2010/0039822 A1 | 2/2010 | Bailey | 362/296 |
| 2010/0051995 A1 | 3/2010 | Katsuno et al. | |
| 2010/0059785 A1 | 3/2010 | Lin et al. | |
| 2010/0065881 A1 | 3/2010 | Kim | |
| 2010/0078656 A1 | 4/2010 | Seo | |
| 2010/0103678 A1 | 4/2010 | Van de Ven et al. | 362/294 |
| 2010/0117099 A1 | 5/2010 | Leung | 257/88 |
| 2010/0117111 A1 | 5/2010 | Illek et al. | 257/98 |
| 2010/0140635 A1 | 6/2010 | Ibbetson et al. | |
| 2010/0140636 A1 | 6/2010 | Donofrio et al. | 257/98 |
| 2010/0151604 A1 | 6/2010 | Kal et al. | |
| 2010/0155746 A1 | 6/2010 | Ibbetson | 257/88 |
| 2010/0158437 A1 | 6/2010 | Decorby | 385/14 |
| 2010/0163887 A1 | 7/2010 | Kim | 257/76 |
| 2010/0163900 A1 | 7/2010 | Seo et al. | |
| 2010/0165633 A1 | 7/2010 | Moolman et al. | 362/398 |
| 2010/0170035 A1 | 7/2010 | Kik | |
| 2010/0171094 A1 | 7/2010 | Lu et al. | |
| 2010/0171135 A1 * | 7/2010 | Engl | H01L 33/382 257/98 |
| 2010/0252840 A1 | 10/2010 | Ibbetson et al. | |

(56) References Cited

U.S. PATENT DOCUMENTS

| | | | |
|---|---|---|---|
| 2010/0279737 A1 | 11/2010 | Neff et al. ................. | 438/14 |
| 2010/0308354 A1 | 12/2010 | David et al. ................. | 257/98 |
| 2010/0327295 A1 | 12/2010 | Peng et al. ................. | 257/88 |
| 2011/0001148 A1 | 1/2011 | Sun et al. ................. | 257/88 |
| 2011/0001412 A1 | 1/2011 | Aanegola et al. ............ | 313/501 |
| 2011/0001422 A1 | 1/2011 | Aanegola et al. ............ | 313/501 |
| 2011/0025190 A1 | 2/2011 | Jagt ................. | 313/499 |
| 2011/0044027 A1 | 2/2011 | Chen ................. | 362/97 |
| 2011/0049546 A1 | 3/2011 | Heikman et al. ............. | 257/98 |
| 2011/0075423 A1 | 3/2011 | Van De Ven | |
| 2011/0084294 A1 | 4/2011 | Yao ................. | 257/93 |
| 2011/0156064 A1* | 6/2011 | Seo ................. | H01L 25/0753 257/88 |
| 2011/0182073 A1 | 7/2011 | Sanpei et al. ................. | 362/294 |
| 2011/0266568 A1* | 11/2011 | Aldaz ................. | H01L 33/145 257/98 |
| 2011/0284896 A1* | 11/2011 | Park ................. | H01L 33/46 257/98 |
| 2012/0025244 A1 | 2/2012 | Suh, II ................. | 257/98 |
| 2012/0074441 A1 | 3/2012 | Seo | |
| 2012/0086026 A1* | 4/2012 | Engl ................. | H01L 27/156 257/93 |
| 2012/0280263 A1 | 11/2012 | Ibbetson et al. | |
| 2013/0292710 A1* | 11/2013 | Kim ................. | H01L 33/50 257/88 |
| 2013/0341634 A1* | 12/2013 | Heikman ................. | H01L 33/46 257/76 |
| 2014/0167065 A1 | 6/2014 | Bergman et al. | |
| 2014/0217439 A1* | 8/2014 | Jeon ................. | H01L 33/46 257/98 |
| 2014/0312373 A1 | 10/2014 | Donofrio et al. | |
| 2015/0200230 A1* | 7/2015 | Jang ................. | H01L 27/156 257/91 |
| 2015/0280066 A1* | 10/2015 | Fujimura ................. | H01L 33/24 257/98 |

FOREIGN PATENT DOCUMENTS

| | | |
|---|---|---|
| CN | 101103467 | 1/2008 |
| CN | 201007449 | 1/2008 |
| CN | 101449100 | 6/2009 |
| CN | 101460779 | 6/2009 |
| CN | 101460779 A | 6/2009 |
| DE | 102004040277 | 2/2006 |
| DE | 102007003282 | 7/2008 |
| DE | 102008005497 | 7/2009 |
| DE | 102008035900 | 11/2009 |
| EP | 1750310 A2 | 2/2007 |
| EP | 2259345 A1 | 12/2010 |
| EP | 2369650 A2 | 9/2011 |
| JP | 06045649 | 2/1994 |
| JP | 06268252 | 9/1994 |
| JP | 2005197289 | 7/2005 |
| JP | 2010-87282 A | 4/2010 |
| KR | 100843426 B1 | 7/2008 |
| TW | 595689 | 5/2003 |
| TW | 595689 | 6/2004 |
| TW | M281297 | 11/2005 |
| TW | 200805717 | 1/2008 |
| TW | 200834991 | 8/2008 |
| WO | WO 2000/034709 A1 | 6/2000 |
| WO | WO 2005/066539 A1 | 7/2005 |
| WO | WO 2005/078338 A1 | 8/2005 |
| WO | WO 2005078338 | 8/2005 |
| WO | WO 2005117152 | 12/2005 |
| WO | WO 2006/092697 A1 | 9/2006 |
| WO | WO 2007121739 | 1/2007 |
| WO | WO 2007115040 | 10/2007 |
| WO | WO 2007115040 A2 | 10/2007 |
| WO | WO 2007/130536 A2 | 11/2007 |
| WO | WO 2007121739 A2 | 11/2007 |
| WO | WO 2008089324 A2 | 7/2008 |
| WO | WO 2008089324 A3 | 7/2008 |
| WO | WO 2008107654 | 9/2008 |
| WO | WO 2008149250 | 12/2008 |
| WO | WO 2009/056927 A1 | 5/2009 |
| WO | WO 2010/029475 A1 | 3/2010 |
| WO | WO 2010029475 | 3/2010 |
| WO | WO 2010029475 A1 | 3/2010 |
| WO | WO 2010151600 | 12/2010 |
| WO | WO 2011031098 A2 | 3/2011 |
| WO | WO 2011071100 A1 | 6/2011 |
| WO | 2012/164456 A1 | 12/2012 |
| WO | 2014/025195 A1 | 2/2014 |

OTHER PUBLICATIONS

U.S. Appl. No. 14/602,040, filed Jan. 21, 2015, Donofrio, et al.
U.S. Appl. No. 13/868,361, filed Apr. 23, 2013, Donofrio, et al.
Examination Report from European Appl. No. 10 725 524.2-1757, dated Jun. 19, 2015.
Third Office Action from Chinese Appl. No. 2011800470694, dated Apr. 29, 2015.
Third Office Action from Chinese Appl. No. 200980149203.4, dated Jul. 3, 2015.
Notice of Allowance from Taiwanese Patent Appl. No. 099110005, dated Jul. 20, 2015.
Office Action from U.S. Appl. No. 14/219,916, dated Jun. 17, 2015.
Margalit et al. "64o C Continuous-Wave Operation of 1.5-um Vertical Cavity Laser", 1997, IEEE Journal od Selected Topics in Quantum Electronics, vol. 3, pp. 359-365.
Office Action from U.S. Appl. No. 14/185,589, dated Jul. 28, 2015.
Office Action from U.S. Appl. No. 14/050,001, dated Jul. 30, 2015.
Office Action from U.S. Appl. No. 13/909,927, dated Apr. 23, 2015.
Office Action from U.S. Appl. No. 12/553,025, dated May 29, 2015.
Office Action from Taiwanese Patent Appl. No. 099110005, dated Mar. 23, 2015.
Office Action from Chinese Patent Appl. No. 200980149205.3, dated Mar. 11, 2015.
Rejection Decision Chinese Patent Appl. No. 201080023107.8, dated Mar. 19, 2015.
Office Action from Taiwanese Patent Appl. No. 099110005, dated Mar. 26, 2015.
Second Office Action from Chinese Patent Appl. No. 2009801492034, dated Jan. 6, 2015.
Office Action and Search Report from Taiwanese Patent Appl. No. 10420278720, dated Mar. 9, 2015.
Office Action from Patent U.S. Appl. No. 12/553,025, dated Jan. 13, 2015.
Sanchez et al. Ion and electron beam assisted growth of nanometric SimOn structures for near field microscopy. Review of Scientific Instruments. vol. 73, #11. 2002. pp. 3901-3907.
Office Action from U.S. Appl. No. 14/185,589, dated Feb. 19, 2015.
Office Action from U.S. Appl. No. 12/606,377, dated Mar. 2, 2015.
Office Action from U.S. Appl. No. 14/219,916, dated Mar. 6, 2015.
Su, et al., "Nitride-Based LED's with n-GaN Current Spreading Layers", 2005, IEEE Electron Devices Letters, vol. 26, No. 12, pp. 891-893: Dec. 2005.
Examiner's Report from European Patent Appl. No. 10 774 320.5-1757, dated Feb. 10, 2015.
European Examination Report from European Patent Appl. No. 10 725 524.2-1757, dated Nov. 3, 2014.
Search Report from Taiwanese Appl. No. 099121883, dated Oct. 2, 2014.
Huang, et al., "High-Performance GaN-Based Vertical-Injection Light-Emitting Diodes With TiO2-SiO2 Omnidriectional Reflector and n-GaN Roughness", IEEE Photonics Technology Letters, vol. 19, No. 8, Apr. 15, 2007.
International Search Report and Written Opinion from PCT/US2014/058896, dated Dec. 22, 2014.
Office Action from U.S. Appl. No. 13/028,946, dated Oct. 28, 2014.
Response to OA from U.S. Appl. No. 13/028,946, filed Dec. 15, 2014.
Office Action from U.S. Appl. No. 14/219,916, dated Oct. 29, 2014.
Office Action from Patent U.S. Appl. No. 13/909,927, dated Nov. 6, 2014.

(56) References Cited

OTHER PUBLICATIONS

Third Office Action from Chinese Appl. No. 201080023107.8. dated Sep. 29, 2014.
Communication from European Appl. No. 13709035.3-1551, dated Oct. 15, 2014.
Office Action from U.S. Appl. No. 12/606,377, dated Sep. 3, 2014.
Response to CA from U.S. Appl. No. 12/606,377, filed Oct. 23, 2014.
Office Action from U.S. Appl. No. 13/370,696, dated Aug. 27, 2014.
Examination Report from European Patent Appl. No. 10774320.5-1757. dated Sep. 5, 2014.
Second Office Action from Chinese Patent Appl. No. 2011800470694. dated Aug. 6, 2014.
International Preliminary Report on Patentability from Appl. No. PCT/US2013/028684, dated Sep. 18, 2014.
First Office Action and Search Report from Chinese Patent Appl. No. 2009-801492053, dated Jun. 20, 2014.
Office Action from Patent U.S. Appl. No. 12/757,179, dated Jul. 15, 2014.
Office Action from U.S. Appl. No. 13/909,927, dated Aug. 8, 2014.
First Office Action from Chinese Patent Application No. 2009-801492034, dated Jun. 24, 2014.
Second OA from Chinese Patent Appl. No. 201080023107.8, dated Mar. 7, 2014.
Office Action from U.S. Appl. No. 12/757,179, dated Mar. 11, 2014.
Office Action from U.S. Appl. No. 13/909,927, dated Apr. 2, 2014.
Office Action from U.S. Appl. No. 12/666,377, dated Apr. 9, 2014.
International Search Report and Written Opinion for PCT Application No. PCT/US2011/001394 dated Nov. 3, 2011.
International Preliminary Report on Patentability from Application No PCT/US09/66938, dated Apr. 3, 2012.
DOM LED Downlighting, Lithonia Lighting: an Acuity Brands, Company, www.lithonia.com, © 2009.
Ecos, Lighting the Next Generation. gothan : a division of Acuity Brands Lighting Inc., © 2008.
Renaissance Lighting brochure, © 2010.
Office Action from U.S. Appl. No. 12/855,500, dated May 31, 2013.
Response to OA from U.S. Appl. No. 12/855,500, filed Sep. 3, 2013.
Office Action from U.S. Appl. No. 13/071,349, dated May 28, 2013.
Response to OA from U.S. Appl. No. 13/071,349, filed Jul. 18, 2013.
Office Action from U.S. Appl. No. 13/071,349, dated Jan. 17, 2013.
Response to OA from U.S. Appl. No. 13/071,349, filed Apr. 10, 2013.
Office Action from U.S. Appl. No. 12/553,025, dated Jun. 19, 2013.
Huang et al. High-Performance GaN-Based Vertical-Injection Light-Emitting Diodes with TiO2—Sio2 Ohnidirectional Reflector and n-GaN Roughness. IEEE Photonics Technology Letters, vol. 19, No. 8, Apr. 15, 2007, pp. 565-567.
Raoufi et al. Surface characterization and microstructure of ITO thin films at different annealing temperatures. Applied Surface Science 253 (2007), pp. 9085-9090.
Office Action from U.S. Appl. No. 13/168,689, dated Jun. 28, 2013.
Office Action from U.S. Appl. No. 12/606,377, dated Nov. 26, 2012.
Response to OA from U.S. Appl. No. 12/606,377, filed Feb. 22, 2013.
Office Action from U.S. Appl. No. 12/757,179, dated Dec. 31, 2012.
Response to OA from U.S. Appl. No. 12/757,179, filed Apr. 23, 2013.
Office Action from U.S. Appl. No. 13/415,626, dated Feb. 28, 2013.
Response to OA from U.S. Appl. No. 13/415,626, filed Apr. 17, 2013.
"Handbook of Optical Constants of Solids", edited by E. Palik. Academic Press, 1$^{st}$ edition, Nov. 11, 1997.
International Search Report and Written Opinion from PCT Application No. PCT/US2013/028684. dated May 28, 2013.
Jong Kyu kim, et al., "GaInN Light-emitting Diodes with RuO2/SiO2/Ag Omni-directional Reflector", Applied Physics Letters. AIP. American Institute of Physics. Nelville, NY, US, vol. 84, No. 22, May 31, 2004, pp. 4508-4510, XP012061652.

Y.S. Zhao, et al., "Efficiency Enhancement of InGaN/GaN Light-Emitting Diodes with a Back-Surface distributed Bragg Reflector", Journal of Electronic Materials, vol. 32, No. 12, Dec. 1, 2003, pp. 1523-1526, XP055063308.
Xu Qing-tao. et al., "Enhancing Extraction Efficiency from GaN-based LED by Using an Omni-directional Reflector and Photonic Crystal", Optoelectronics Letters, vol. 5, No. 6, Nov. 1, 2009, pp. 405-408, XP055063309.
J.Q XI. et al., "Optical Thin-film Materials with Low Refractive Index for Broadband Elimination of Fresnel Reflection", Nature Photonics, Nature Publishing Group, UK, vol. 1. No. 3, Mar. 1, 2007, pp. 176-179, XP002590687.
International Search Report and Written Opinion for Application No. PCT/US2012/034564, dated Sep. 5, 2012.
First Office Action from Japanese Patent Appl. No. 201180047069. 4, dated Dec. 18, 2013.
Search Report from Japanese Patent Appl. No. 201180047069.4, dated Dec. 18, 2013.
Comments on the Written Opinion and Amendment of the Application from European Patent Appl. No. 12723543.0, dated Feb. 21, 2014.
Notice of Reasons for Rejection from Japanese Patent Appl. No. 2011-539526, dated Jun. 25, 2013 First Office Action and Search Report from Chinese Patent Appl. No. 201080023107.8, dated Jul. 12, 2013.
Office Action from U.S. Appl. No. 12/655,500, dated Dec. 4, 2013.
Decision of Patent Grant from Japanese Patent Appl. No. 2011-539526, dated Oct. 22, 2013.
Windisch et al. "Impact of Texture-Enhanced Transmission on High-Efficiency Surface-Textured Light-Emitting Diodes." Applied Physics Letters, vol. 79. No. 15, Oct. 2001, pp. 2315-2317.
Schnitzer et al. "30% External Quantum Efficiency From Surface Textured, Thin-Film Light-Emitting Diodes." Applied Physics Letters, Oct. 18, 1993, vol. 64. No. 16, pp. 2174-2176.
Windisch et al. "Light-Extraction Mechanisms in High-Efficiency Surface-Textured Light-Emitting Diodes," IEEE Journal on Selected Topics in Quantum Electronics, vol. 8, No. 2, Mar./Apr. 2002, pp. 248-255.
Streubel, et al. "High Brightness AlGaInP Light-Emitting Diodes," IEEE Journal on Selected Topics in Quantum Electronics, vol. 8, No. 2, Mar./Apr. 2002, pp. 321-332.
CREE EZ400 LED Data Sheet, 2007 Cree's EZBright LEDs.
CREE EZ700 LED Data Sheet. 2007 Cree's EZBright LEDs.
CREE EZ1000 LED Data Sheet, 2007 Cree's EZBright LEDs.
CREE EZBright290 LED Data Sheet, 2007 Cree's EZBright LEDs.
International Search Report and Written Opinion for counterpart Application No. PCT/US2009/066938 dated Aug. 30, 2010.
International Search Report and Written Opinion for PCT Application No. PCT/US2010/002827 dated May 2, 2011 (1).
Office Action from U.S. Appl. No. 12/418,796, dated Jul. 20, 2011.
Office Action from U.S. Appl. No. 12/329,722, dated Oct. 27, 2010.
U.S. Appl. No. 11/656,759, filed Jan. 22, 2007, Chitnis, et al.
U.S. Appl. No. 11/899,790, filed Sep. 7, 2007, Chitnis, et al.
U.S. Appl. No. 11/473,089, filed Jun. 21, 2006, Tarsa, et al.
Final Office Action from U.S. Appl. No. 12/553,025, dated Dec. 31, 2013.
Lin, et al., "Enhancement of InGaN—GaN Indium-Tin-Oxide Flip-Chip Light-Emitting Diodes with TiO2—SiO2 Multilayer Stack Omnidirectional Reflector", IEEE Photonics Technology Letters, vol. 18, No. 19, Oct. 1, 2006.
T-Clad Thermal Substrates Overview from The Berquist Company: www.begquestcompany.com.
Office Action from U.S. Appl. No. 14/699,302; dated Apr. 5, 2016.
Office Action for Korean Application No. 10-2011-7015872; dated May 26, 2016.
Notice of Allowance for Application No. 099121883; dated Jun. 2, 2016.
Office Action from U.S. Appl. No. 14/050,001; dated Jun. 23, 2016.
International Search Report and Written Opinion, International application No. PCT/US2016/013711, International filing date Jan. 15, 2016, dated Jun. 29, 2016.
Certificate of Invention from Chinese Patent appl. No. 200980149205. 3, dated Dec. 16, 2015.

(56) References Cited

OTHER PUBLICATIONS

Notice of Allowance from Chinese Patent Appl. No. 200980149203.4, dated Dec. 4, 2015.
Notification of Reexamination from Chinese Patent appl. No. 201080023107.8, dated Dec. 2, 2015.
Office Action from Chinese Patent appl. No. 201180047069.4, dated Dec. 24, 2015.
Examination Report from European Patent Appl. No. 10 774 320.5, dated Jan. 8, 2016.
First Office Action from Chinese Patent Appl. No. 2012800412299, dated Dec. 16, 2015.
Comments on the Written Opinion and Amendment from European Patent Appl. No. 14733925.3, dated Jan. 14, 2016.
Examination from European Patent Appl. No. 10 725 524.2-1757, dated Feb. 3, 2016.
Office Action from U.S. Appl. No. 14/050,001, dated Jan. 29, 2016.
Office Action for U.S. Appl. No. 14/699,302; dated Jul. 28, 2016.
Foreign Office Action for European Application No. 09836676.8; dated Jul. 21, 20016.
Examination from European Patent Appl. No. 09836676.8, dated Oct. 26, 2015.
Office Action Summary from Korean Patent Appl. No. 10-2011-7015872, dated Nov. 6, 2015.
Office Action from Taiwanese Patent Appl. No. 099136758, dated Oct. 26, 2015.
Office Action from U.S. Appl. No. 12/606,377, dated Sep. 18, 2015.
Office Action from U.S. Appl. No. 12/553,025, dated Nov. 10, 2015.
Office Action and Search Report from Taiwanese Patent Appl. No. 10421191660, dated Sep. 2, 2015.
Notice of Issuance from Chinese Patent Application No. 200980149205.3, dated Sep. 24, 2015.
Office Action for U.S. Appl. No. 14/699,302; dated Nov. 2, 2017.
Chinese Notification of Reexamination for Application No. 2011800470694; dated Jan. 3, 2018.
Office Action for U.S. Appl. No. 14/860,483; dated Mar. 7, 2018.
Office Action for U.S. Appl. No. 14/699,302; dated May 31, 2018.
Notice of Allowance for Korean Application No. 10-2011-7015872: dated Sep. 29, 2016.
Office Action for Taiwan Application No. 099136758: dated Oct. 12, 2016.
Notice of Allowance for European Application No. 10774320.5: dated Oct. 27, 2016.
Office Action for U.S. Appl. No. 14/050,001: dated Dec. 21, 2016.
Chinese Grant Decision for Application No. 201080023107.8, dated Jan. 12, 2017.
Foreign Office Action for European Application No. 10725524.2; dated Jan. 19, 2017.
Foreign Office Action for European Application No. 9801584.5: dated Feb. 9, 2017.
Office Action for U.S. Appl. No. 14/860,483: dated Feb. 9, 2017.
Foreign Office Action for Chinese Application No. 201180047069.4; dated Mar. 2, 2017.
Chinese Office Action for Application No. 201280041229.9; dated Apr. 28, 2017.
Chinese Office Action for Application No. 2014800322484 ; dated Jun. 2, 2017.
Office Action for U.S. Appl. No. 14/699,302; dated Jun. 16, 2017.
Office Action for U.S. Appl. No. 14/860,483; dated Aug. 10, 2017.

\* cited by examiner

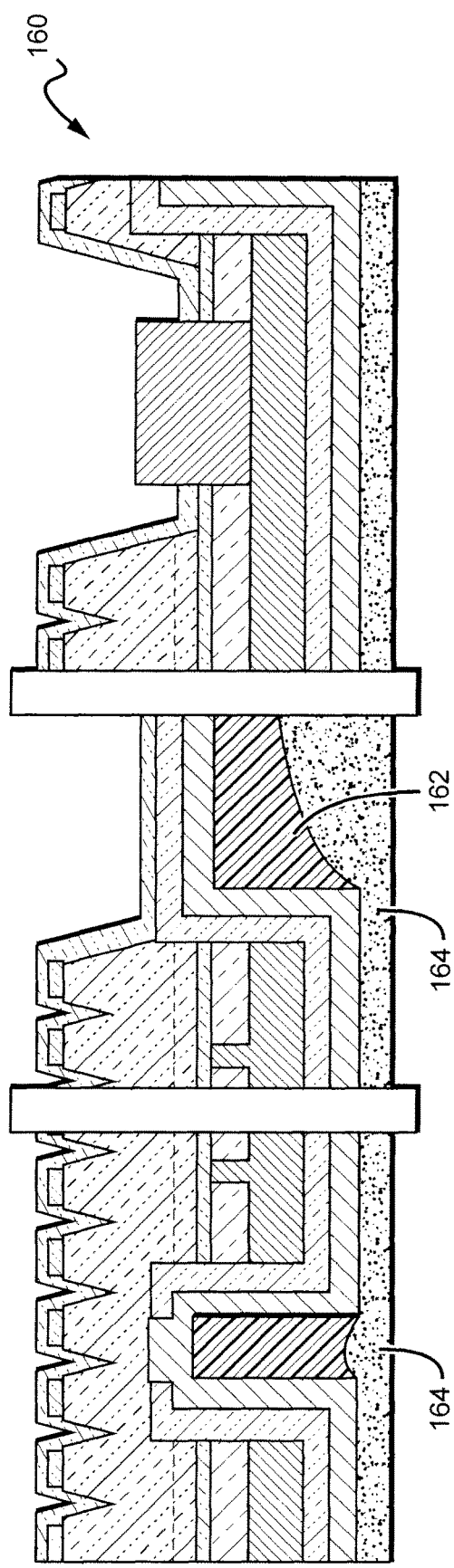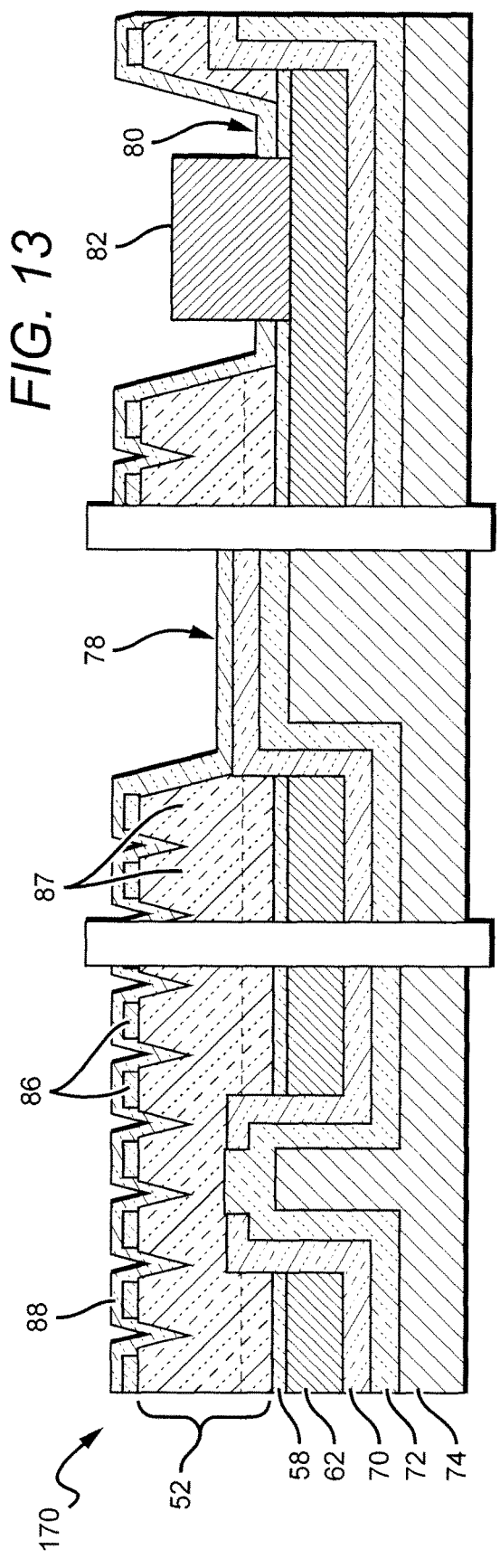

HIGH EFFICIENCY LEDS AND METHODS OF MANUFACTURING

BACKGROUND OF THE INVENTION

Field of the Invention

This invention relates to light emitting diodes, and more particularly to light emitting diodes having high reflectivity mirrors.

Description of the Related Art

Light emitting diodes (LED or LEDs) are solid state devices that convert electric energy to light, and generally comprise one or more active layers of semiconductor material sandwiched between oppositely doped n-type and p-type layers. When a bias is applied across the doped layers, holes and electrons are injected into the active layer where they recombine to generate light. Light is emitted from the active layer and from all surfaces of the LED.

For typical LEDs it is desirable to operate at the highest light emission efficiency, and one way that emission efficiency can be measured is by the emission intensity in relation to the input power, or lumens per watt. One way to maximize emission efficiency is by maximizing extraction of light emitted by the active region or active structure of LEDs. For conventional LEDs with a single out-coupling surface, the external quantum efficiency can be limited by a number of factors, such as total internal reflection (TIR) of light from the LED's emission region. TIR can be caused by the large difference in the refractive index between the LED's semiconductor and surrounding ambient. Some LEDs have relatively low light extraction efficiencies because of the high index of refraction of the substrate compared to the index of refraction for the surrounding material, such as epoxy. This difference results in a small escape cone from which light rays from the active area can transmit from the substrate into the epoxy and ultimately escape from the LED package. Light that does not escape can be absorbed in the semiconductor material or at surfaces that reflect the light.

Different approaches have been developed to reduce TIR and improve overall light extraction, with one of the more popular being surface texturing. Surface texturing increases the light escape probability by providing a varying surface that allows photons multiple opportunities to find an escape cone. Light that does not find an escape cone can continue to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. *30% External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002]. U.S. Pat. No. 6,657,236, also assigned to Cree Inc., discloses structures formed on the semiconductor layers for enhancing light extraction in LEDs.

Another way to increase light extraction efficiency is to provide reflective surfaces that reflect light so that it contributes to useful emission from the LED chip or LED package. In a typical LED package 10 illustrated in FIG. 1, a single LED chip 12 is mounted on a reflective cup 13 by means of a solder bond or conductive epoxy. One or more wire bonds 11 can connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. At least some of the light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected. Some light may be absorbed by the reflector cup due to the less than 100% reflectivity of practical reflector surfaces. Some metals can have less than 95% reflectivity in the wavelength range of interest.

FIG. 2 shows another LED package in which one or more LED chips 22 can be mounted onto a carrier such as a printed circuit board (PCB) carrier, substrate or submount 23. A metal reflector 24 mounted on the submount surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond. The metal reflector 24 may also experience optical losses when the light is reflected because it also has less than 100% reflectivity.

The reflectors shown in FIGS. 1 and 2 are arranged to reflect light that escapes from the LED. LEDs have also been developed having internal reflective surfaces or layers to reflect light internal to the LEDs. FIG. 3 shows a schematic of an LED chip 30 with an LED 32 mounted on a submount 34 by a metal bond layer 36. The LED further comprises a p-contact/reflector 38 between the LED 32 and the metal bond 36, with the reflector 38 typically comprising a metal such as silver (Ag). This arrangement is utilized in commercially available LEDs such as those from Cree® Inc., available under the EZBright™ family of LEDs. The reflector 38 is integral to the LED chip 30 and can reflect light emitted from the LED chip's active region toward the submount back toward the LED's primary emitting surface. The reflector also reflects TIR light back toward the LED's primary emitting surface. Like the metal reflectors above, reflector 38 reflects less than 100% of light and in some cases less than 95%. The reflectivity of a metal film on a semiconductor layer may be calculated from the materials' optical constants using thin film design software such as TFCalc™ from Software Spectra, Inc. (www.sspectra.com).

Additional LED chips have been developed with internal reflectors, with some of these LED chips also comprising other structures to allow for contacting the active epitaxial structure. Some of these features allow for applying a signal to the active structure of the LED chip though other layers. These structures can include different combinations of conductive features (e.g. layers, contacts and/or vias) and insulating features (e.g. dielectric and/or passivation layers). These features can be included in both vertical and lateral geometry LED chips. The structures can be relatively complex and can involve complex manufacturing processes with some of these structures requiring nine or more major fabrication steps to form the desired build.

SUMMARY OF THE INVENTION

The present invention relates to simplified chip architectures or chip builds that can result in simpler manufacturing processes using fewer steps. The LED structure can have fewer layers than conventional LED chips with the layers arranged in different ways for efficient fabrication and operation.

One embodiment of an LED chip according to the present invention comprises an active LED structure comprising an active region between two oppositely doped layers, with the active region emitting light in response to an electrical signal applied to the oppositely doped layer. A first reflective layer is included adjacent to one of the oppositely doped layers. A second reflective layer is included on the first reflective layer, with the second reflective layer reflecting light not reflected by the first reflective layer and the second reflective layer extending beyond the edge of the active LED structure.

Another embodiment of an LED chip according to the present invention comprises an active LED structure having an active region between two oppositely doped layers, with the active region emitting light in response to an electrical signal applied to the oppositely doped layer. A dielectric reflective layer is included on one of said oppositely doped layers and extending beyond the edge of the active region. A metal reflective layer is also included on the first dielectric reflective layer.

One embodiment of a method for forming LED chips comprises depositing active structure epitaxial layers on a wafer. The method also comprises etching different portions of the active structure in a single etch step, wherein the different portions etch at different rates and wherein at least one of the portions is self-limiting to the etch.

Another embodiment of a method for forming LED chips comprising forming an active structure of epitaxial layers and forming a plurality of reflective layers on said active structure. The method further comprises performing a single etch step to form a self-aligned via hole through the reflective layers to the active structure.

Still another embodiment of an LED chip according to the present invention comprises an active LED structure comprising an active region between two oppositely doped layers. A dielectric reflective layer is included adjacent to one of the oppositely doped layers. A metal reflective layer is on the dielectric reflective layer, wherein the dielectric and metal reflective layers extend beyond the edge of said active region.

These and other aspects and advantages of the invention will become apparent from the following detailed description and the accompanying drawings, which illustrate by way of example the features of the invention.

BRIEF DESCRIPTION OF THE DRAWINGS

FIG. 12 is a sectional view of another LED chip according to the present invention; and FIG. 13 is a sectional view of still another embodiment of an LED chip according to the present invention.

DETAILED DESCRIPTION OF THE INVENTION

Figure 1:
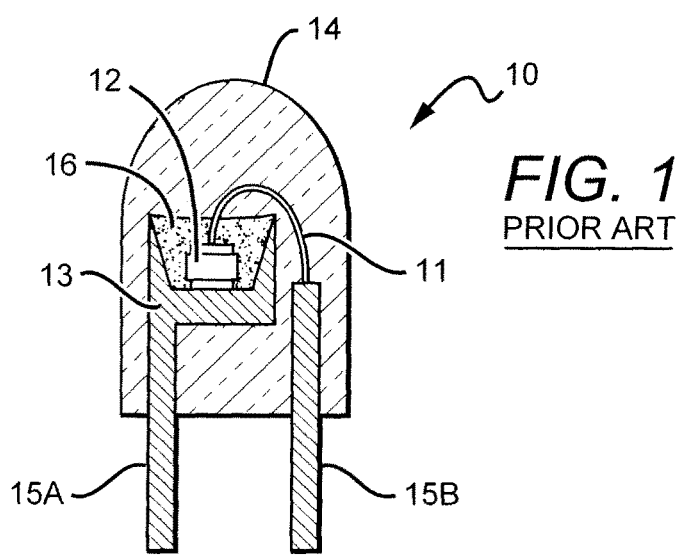
FIG. 1 is a sectional view of one embodiment of a prior art LED lamp.
Figure 2:
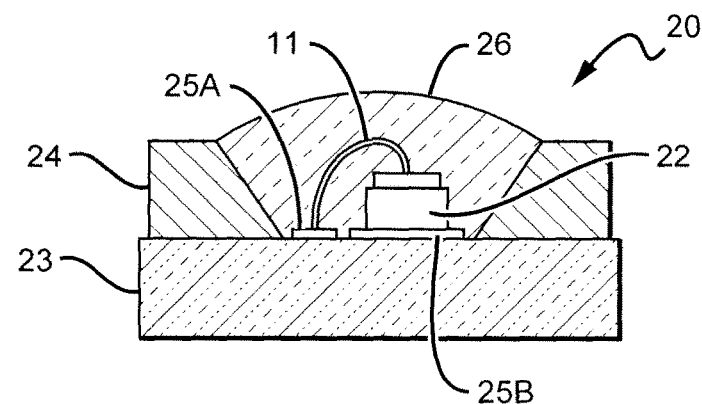
FIG. 2 is a sectional view of another embodiment of a prior art LED lamp.
Figure 3:
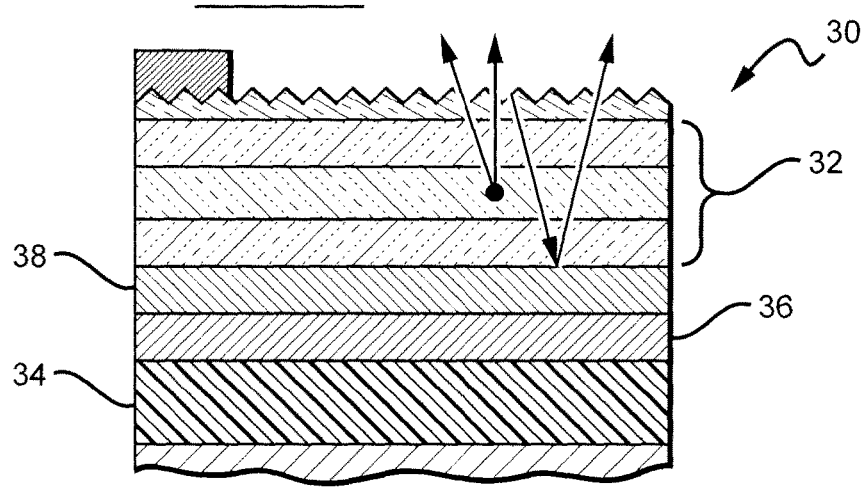
FIG. 3 is a sectional view of another embodiment of a prior art LED chip.

The present invention is directed to simplified LED chip structures/builds that can be fabricated using methods with fewer steps, while still providing LED chips with efficient light emission. The present invention is directed to LED chips having internal or integral reflective surfaces/layers arranged to increase the emission efficiency of the emitters. The present invention can be used as a reflector in conjunction with one or more contacts, or can be used as a reflector separate from the contacts.

The LED chips according to the present invention can comprise an active LED structure. A dielectric reflective layer is included adjacent to one of the oppositely doped layers. A metal reflective layer is on the dielectric reflective layer, wherein the dielectric and metal reflective layers extend beyond the edge of said active region. By extending the dielectric layer, the LED chips can emit with more efficiency by reflecting more LED light to emit in the desired direction. By extending the metal reflective layer beyond the edge of the active region, the metal reflective layer can serve as a current spreading layer and barrier, in addition to reflecting LED light to emit in the desired direction. The LED chips can also comprise self-aligned and self-limiting features that simplify etching processes during fabrication.

The dielectric reflective layer can comprise a material with a different index of refraction (IR) than the active LED structure. In most embodiments, the dielectric reflective layer can comprise a layer with an IR that is primarily lower at or near its interface with the active LED structure. Some embodiments of LED chips according to the present invention can also comprise a second reflective layer, metal layer or mirror stack ("mirror stack") that can be on and used in conjunction with the dielectric reflective layer such that light passing through the dielectric reflective layer (e.g. not experiencing TIR) can be reflected by the second reflective layer.

These internal or integral reflective layers can reduce optical emission losses that can occur by light being emitted in an undesirable direction where it can be absorbed. Light that is emitted from the emitter's active LED structure in a direction away from useful light emission, such as toward the substrate, submount, or metal reflector can be reflected by the first reflective layer. The reflective surfaces can be positioned to reflect this light so that it emits from the LED chip in a desirable direction.

The dielectric reflective layer can comprise many different materials, with some embodiments comprising a dielectric material such as SiO$_2$. It is understood that many other materials can be used with refractive indexes that are lower or higher, with the preferred having an IR that up to approximately 50% smaller than the LED's active structure material. In other embodiments the IR of the dielectric reflective layer can be up to approximately 40% smaller than the active structure material, while in other embodiments it can be up to approximately 30% smaller.

Many conventional LEDs can rely primarily on a metal reflector layer made of different material such as Ag or Au. As described above, there can be losses with each reflection off metal reflectors, and these losses can be significant particularly for light making multiple passes and reflections in the LED. There are no optical losses in light reflected by TIR, so that when more light is reflected using TIR instead of a metal material, the emission efficiency of the LED can increase.

Different embodiments of emitters according to the present invention can also utilize other structures, layers or features that allow for efficient and reliable LED operation. In some embodiments, a current spreading layer can be included in proximity to the reflective layer to provide for spreading of current into the one or more layers of the active LED structure. In other embodiments, materials can be included to provide for reliable adhesion between different layers, such as between the low IR layer and the metal reflective layer. Different embodiments of the invention also provide conductive via or path arrangements that provide conductive paths through insulating layers such as the reflective/dielectric layer. Some of these features allow for an electric signal to pass through the dielectric reflective layer along the vias so that the dielectric material layer can be used as an internal layer.

Conventional LED chips can have relatively complex structures that allow for these internal reflector arrangements while at the same time allowing for contacting the active structure with different contact and via arrangements. These complex structures can also lead to relatively complex manufacturing processes. The LEDs according to the present invention comprise simplified LED structures that allow for simplified manufacturing processes. As described in more detail below, some embodiments can comprise a dielectric reflective layer and single layer that can serve as a mirror/barrier/current spreading layer. The LED structure can also comprise a thin contact layer to the p-side of the active structure (e.g. GaN). The thin contact layer can comprise many materials such as ITO and can be have a thickness of less than 1000 Å.

In some embodiments, the LED structure can be further simplified by having a plurality of front side layers self-aligned to the active area mesa edges. (all etched in one etch step). This results in fewer etching steps for formation of features such as vias. The manufacturing of the LED structure can be further simplified by the backside mesas (or streets) and light extraction features being formed in one etch step as described below. This is particularly useful for structures that require differing etch times for the mesas and the light extraction features. In some embodiments, one that requires less etch time can be self-limiting to allow for additional etch time for the other features.

In some embodiments the dielectric layer mentioned above can comprise many different materials, with some embodiments comprising SiO$_2$. LED structures with hybrid dielectric mirror consisting of a SiO$_2$ layer with a single mirror/barrier/current spreading layer and thin ITO p-contact (<1000 A) can be self-aligned to the active area mesas. The SiO$_2$ layer can serve as both a reflective element and junction passivation layer.

In some embodiments, the external p-contact can then be formed on the mirror stack by etching through layers down to the mirror stack. In these embodiments, having the mirror layer extend out past the mesa for p-contacting instead of the light absorbing barrier layer used in the conventional structures can reduce light absorption.

The present invention is described herein with reference to certain embodiments but it is understood that the invention can be embodied in many different forms and should not be construed as limited to the embodiments set forth herein. In particular, dielectric reflective layer can comprise many different material layers and can have many different thicknesses beyond those described herein. The dielectric layer is described herein as a layer of one material, such as a particular dielectric, but it is understood that it can comprise many different materials, and in some embodiments it can comprise more than one layer. The dielectric layer can also be in many different locations on different LED chips beyond those described herein, and can be used on different devices beyond solid state emitters. Furthermore, the first reflective layer can be provided with or without conductive structures to allow electrical signals to pass through. It is understood that LED chips according to the present invention can also utilize single layer dielectric layers in conjunction with other reflectors such as metal reflective layers or DBR layers. The first reflective layer is arranged to maximize the amount of light reflected by TIR, while at the same time maintaining a simple, efficient and cost effective reflecting system.

It is also understood that when an element such as a layer, region or substrate is referred to as being "on", "adjacent" or "in proximity" to another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The present invention is described herein with reference to light emitting diodes (LED or LEDs) or LED chips, but it is understood that it is equally applicable to other solid-state emitters. It is further understood that the present invention can be used in many different LED chips beyond those described herein. The components can have different shapes and sizes beyond those shown and different numbers of LEDs can be included.

Figure 4:
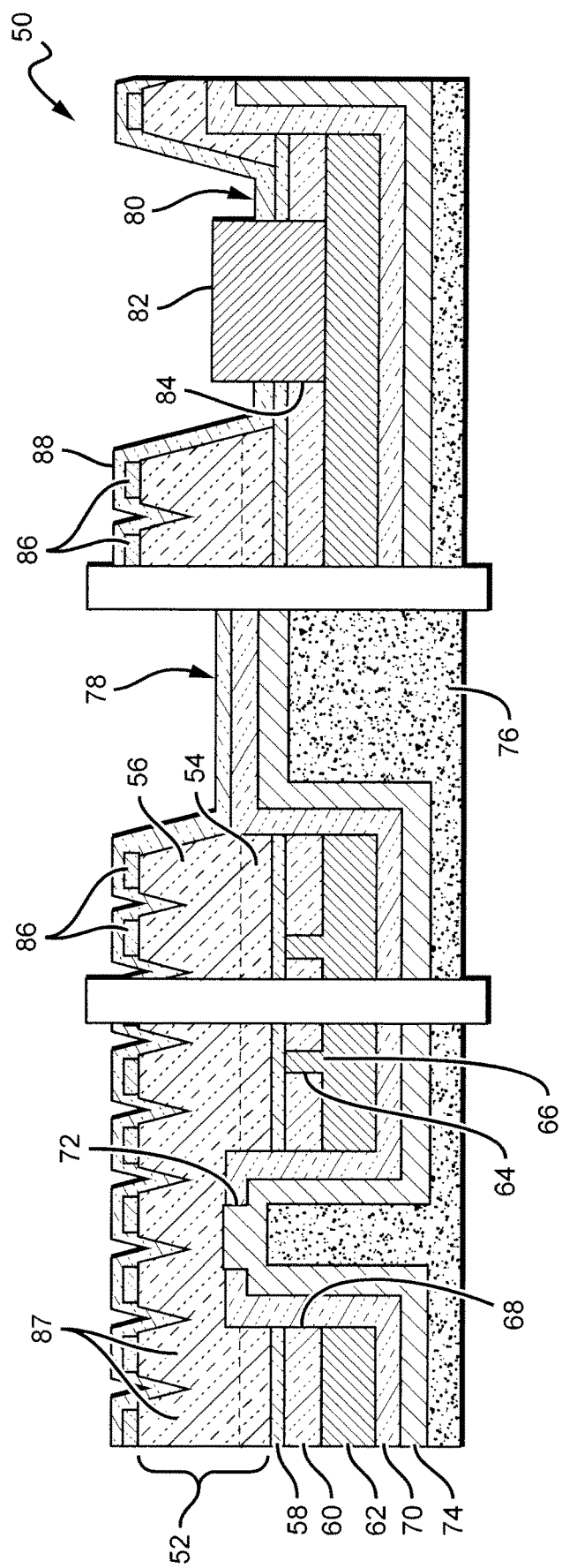
FIG. 4 is a sectional view of one embodiment of an LED chip according to the present.
Figure 5:
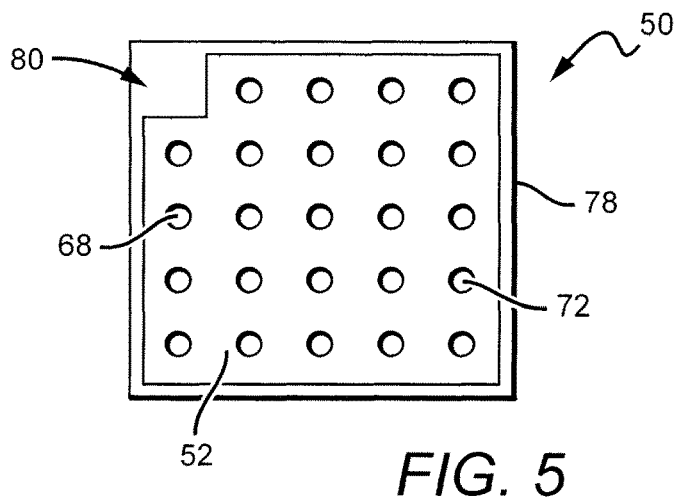
FIG. 5 is a top view of one embodiment of an LED chip according to the present invention.

FIGS. 4 and 5 show one embodiment of an LED chip 50 according to the present invention that is arranged with a simplified structure that allows for simplified fabrication. Although the present invention is described with reference to fabrication of a single LED chip it is understood that the present invention can also be applied to wafer level LED fabrication, fabrication of groups of LEDs, or fabrication of packaged LED chips. The wafer or groups of LEDs can then be separated into individual LED chips using known singulation or dicing methods. The present invention can also be used in different LEDs having different geometries, such lateral geometry or vertical geometry. The present invention can also be used in LEDs compatible with flip-chip mounting as well as those that are arranged for non flip-chip mounting. The different embodiments of the present invention are particularly applicable to fabricating devices having many of the same features as the as the LED chips available from Cree, Inc. under their EZ, WZ and/or DA product family designation.

The LED chip 50 can comprise an LED active region or structure 52 that can have many different semiconductor layers arranged in different ways. The fabrication and operation of LEDs and their active structure are generally known in the art and only briefly discussed herein. The layers of the active structure 52 can be fabricated using known processes with a suitable process being fabrication using MOCVD. The LED chip 50 comprises an active structure 52 having a p-type layer 54, n-type layer 56 and an active region between the two. It is understood that additional layers and elements can also be included in the active structure 52, including but not limited to buffer, nucleation, contact and current spreading layers as well as light extraction layers and elements. The active layer can comprise single quantum well (SQW), multiple quantum well (MQW), double heterostructure or super lattice structures.

The active structure 52 can be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment, the n- and p-type layers are gallium nitride (GaN) and the active layer comprises InGaN. In alternative embodiments the n- and p-type layers may be AlGaN, aluminum gallium arsenide (AlGaAs) or aluminum gallium indium arsenide phosphide (AlGaInAsP) and related compounds.

The active structure 52 can be formed on a growth substrate (not shown) and the growth substrate can be made of many materials such as sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III-nitrides than sapphire and results in Group III-nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in U.S. Pat. Nos. Re. 34,861; 4,946,547; and 5,200,022. In the embodiment shown, the growth substrate has been removed, but in other embodiments all or a portion of the substrate can remain, with some of these embodiments having textured portions to enhance light extraction.

Different embodiments of the active structure can emit different wavelengths of light depending on the composition of the active layer and n- and p-type layers. In some embodiments, the active structure emits a blue light in the wavelength range of approximately 450 to 460 nm. The LED chip 50 can also be covered with one or more conversion materials, such as phosphors, such that at least some of the light from the LED passes through the one or more phosphors and is converted to one or more different wavelengths of light. In one embodiment, the LED chip emits a white light combination of light from the LED's active structure and light from the one or more phosphors. In other embodiments, a remote phosphor can be provided that is in the path emitted from the LED chip 50 to convert the light remotely from the LED chip 50.

"Front side" fabrication discussed herein refers to fabrication of those layers adjacent the p-type layer 54, and in the embodiment shown would be those layers arranged below the active structure 50. In this embodiment front side also refers to the side opposite the LED chips primary emission surface. "Back side" fabrication then generally refers to fabrication on the side opposite the front side fabrication.

As mentioned above, the LED chip 50 can comprise a simplified/hybrid mirror arrangement that allows for simplified fabrication of the LED chip 50. In some embodiments, the hybrid mirror can comprise current spreading layer 58 on the p-GaN, a dielectric reflective layer (e.g. SiO2) 60 and a mirror stack (single mirror/barrier/current spreading layer) 62 on the dielectric layer 60. It is understood, however, that other embodiments can comprise many different simplified/hybrid mirrors arranged in different ways. In some embodiments, these front side layers can be self-aligned to the active area mesa edges. Stated differently, and as more fully described below, these layers (in addition to others) can be etched to one step to the epitaxial material, which can simplify the overall fabrication process.

The spreading layer 58 can be on the active structure 52 in a location to aid in current spreading into the p-type layer. In the embodiment shown the current spreading layer 58 can cover some or the entire p-type layer and in some embodiments the current spreading layer 58 helps spread current from a p-type contact 64 across the surface of the p-type layer. This helps to provide improved current spreading across the p-type layer with a corresponding improvement in current injection from the p-type layer to the active region.

The current spreading layer 58 can comprise many different materials and is typically a transparent conductive oxide such as indium tin oxide (ITO) or a metal such as platinum (Pt), although other materials can also be used. The current spreading layer 58 can have many different thicknesses, with the present invention having a thickness small enough to minimize absorption of light from the active structure that passes through the current spreading layer. In some embodiments, the current spreading layer 58 comprising ITO, and can have thicknesses less than 1000 angstroms (Å). In still other embodiments it can have a thickness less than 700 Å, while other embodiments can have a thickness less than 500 Å. Still other embodiments can have a thickness in the range of 50 to 300 Å, with some of these embodiments having a current spreading layer with a thickness of approximately 200 Å. The current spreading layer 58 as well as the reflective layers described below can be deposited using known methods. It is understood that in embodiments where current spreading is not a concern, the LED chips can be provided without a current spreading layer.

The dielectric reflective layer 60 that in the embodiment shown is formed on the current spreading layer with current spreading layer between the dielectric layer 60 and active structure 52. It is understood, however, that in other embodiments the dielectric reflective layer 60 can be formed directly on the active structure 52, while in other embodiments other layers can be between the active structure 52 and the dielectric layer 60. The dielectric layer 60 can comprise many different materials and preferably comprises a material that presents an index of refraction (IR) step between the material comprising the active structure 52. Stated differently, the dielectric layer 60 can have an IR that is smaller than the active structure to promote total internal reflection (TIR). Light that experiences TIR is reflected without experiencing absorption or loss, and TIR allows for the efficient reflection of active structure light so that it can contribute to useful or desired LED chip emission.

The dielectric reflective layer 60 can comprise a material having an IR less than 2.3, while other embodiments can have an IR less than 2.15. In still other embodiments the IR can be less than 2.0. Many different materials can be used and in some embodiments the dielectric layer 60 can comprise $SiO_2$. It is understood that other dielectric materials can be used such as SiN, Si, Ge, MgOx, MgNx, ZnO, SiNx, SiOx, AlN, and alloys or combinations thereof. The dielectric layer 60 can also comprise a plurality of different layers. In some embodiments the dielectric layer can comprise a $SiO_2$ layer with one or more layers of different material. In some embodiments a $TiO_2$ layer can be used with a $SiO_2$ layer. In still other embodiments the dielectric layer can comprise multiple layers in the form of a distributed Bragg reflector (DBR).

Some Group III nitride materials, such as GaN, can have an IR of approximately 2.4, and $SiO_2$ has an IR of approximately 1.46. Embodiments with an active LED structure 52 comprising GaN and that also comprises a $SiO_2$ dielectric layer, can have a sufficient IR step between the two to allow for efficient TIR of light at the junction between the two. GaN material of the active structure 52 has an IR of 2.4 and the $SiO_2$ material of the dielectric reflective layer 60 has an IR of 1.46. This represents a difference in IR between the two of approximately 39%. The dielectric reflective layer 60 can have different thicknesses depending on the type of material, with some embodiments having a thickness of at least 0.2 microns (μm). In some of these embodiments it can have a thickness in the range of 0.2 to 0.7 μm, while in some of these embodiments it can be approximately 0.5 μm thick.

As mentioned above, the LED chips 50 according to the present invention can also utilize a second reflective layer, referred to above as mirror stack 62, to reflect light that does not experience TIR at the junction with the dielectric reflective layer 60 and passes through the dielectric reflective layer 60. The mirror stack 62 can comprise many different materials such as Ag, Au, Al, or combinations thereof, and can comprise multiple layers. In the embodiment shown, the mirror stack 62 can at least partially comprise Ag, with other embodiments comprising a layer that is substantially all Ag. Different embodiments according to the present invention can also comprise an adhesion layer (not shown) between the dielectric reflective layer 60 and the metal stack 62 to promote adhesion between the two. Many different materials can be used for the adhesion layer, such as TiO, TiON, $TiO_2$, TaO, TaON, $Ta_2O_5$, AlO or combinations thereof, with a preferred material being TiON. The adhesion layer can have many different thicknesses from just a few Å to thousands of Å. The thickness of the adhesion layer and the material used should minimize the absorption of light passing to minimize losses of light reflecting off the metal layer 62.

The LED chip 50 further comprises dielectric layer holes (p vias holes) 64 that can pass through the dielectric reflective layer 60, to the current spreading layer 58. The holes 64 can be filled when the mirror stack 62 is deposited and the metal layer material can form dielectric layer vias 66 to the current spreading layer 58. As described in more detail below, the vias 66 provide a conductive path through the reflective layer 60, with the electrical signal originating from the p-contact, passing through the mirror stack 62, through the vias 66, and to the current spreading layer 58.

The holes 64 can be formed using many known processes such as conventional etching processes or mechanical processes such as microdrilling. The holes 64 can have many different shapes and sizes, with the holes in the embodiment shown having a circular cross-section with a diameter of less than 20 μm. In some embodiments, the holes can have a diameter of approximately 8 μm, with others having a diameter down to 1 μm. Adjacent holes 64 can be less than 100 μm apart, with the embodiment shown having a spacing of 30 μm spacing from edge to edge. In still other embodiments, the vias can have a spacing of as low as 10 μm or less. It is understood that the holes 64 (and resulting vias 100) can have cross-sections with different shapes such as square, rectangular, oval, hexagon, pentagon, etc. In other embodiments the holes are not uniform size and shapes and there can be different or nonuniform spaces between adjacent holes.

In other embodiments different structures can be used to provide a conductive path between the p-contact and the current spreading layer. Instead of holes an interconnected grid can be formed through the dielectric reflective layer 60, with a conductive material then being deposited in the grid to form the conductive path through the composite layer. The grid can take many different forms, with portions of the grid interconnecting at different angles in different embodiments. An electrical signal applied to the grid can spread throughout and along the interconnected portions. It is further understood that in different embodiments a grid can be used in combination with holes, while other embodiments can provide other conductive paths. In some embodiments one or more conductive paths can run outside the LED chip's active layer such as along a side surface of the LED chip.

An n-type via hole 68 can be formed through the mirror stack 62, dielectric reflective layer 60 and the current spreading layer 58, the p-type layer 54 and to the n-type layer 56. In the embodiment shown, formation of the via hole 68 can take place in a single etch step. This is referred to as layers being "self-aligned." A front side passivation layer 70 can then be included on the inside surface of the via hole 66, and can continue to cover the exposed bottom surface of the mirror stack 62. The passivation layer 70 can protect and provide electrical insulation between layers and can comprise many different materials, such as a dielectric material. A contact hole 72 can be formed through the passivation layer 70 to the n-type layer 56.

A conductive layer can be included that forms n-type layer via 74 which can be on the surface of the via hole 68 and on the passivation layer 70. The via 74 passes through the mirror stack 62, dielectric reflective layer 60, current spreading layer 58, p-type layer 54, and the passivation hole 72 to make contact with the n-type layer 56. In this arrangement, an electrical signal applied to the via 74 is conducted to the n-type layer 56. The via 74 can be made of many different conductive materials, such as a metal. With some via embodiments comprising a layer of metal, such as Al, covering the passivation layer in the hole 66 and continuing on the passivation layer and covering the mirror stack 62. A bond layer 76 can then be included on the via metal layer 74.

As mentioned above, the back side processing refers to processing of the LED chip 50 on the side opposite the dielectric reflective layer 60 and mirror stack 62. When fabricating LED chips at the wafer level, the epitaxial layers are continuous. Mesas or streets are then formed through the epitaxial layers to form the active structures for the individual LEDs. Many different formation methods can be used, such as etching.

In fabrication of the LED chips at the wafer level, a first "street" 78 is formed between adjacent ones of the LED chips. In the embodiment shown, front side passivation layer 70 and conductive layer 74 extend beyond the edge of the LED structure 52 and to cover the first street 78. A bond pad area (i.e. second street) 80 is also formed between the LED chips 50 in a location for the p-contact 82. In some embodiments, the bond pad area 80 can be formed in one or more corners of the LED chip 50. In this embodiment, the current spreading layer 58, the dielectric reflective layer 60, and the mirror stack 62 extend into the bond pad area 80 (not the first street 78). A p-contact hole 84 is formed through the current spreading layer 58 and the dielectric reflective layer 60, to expose the mirror stack 62. The p-contact is included in the p-contact hole 80 and in contact with the mirror stack 62 and current spreading layer 58.

During operation, an electrical signal applied to the p-contact spreads primarily to the metal layer 62, through the vias 66, and to the current spreading layer where it spreads into the p-type layer 54. An electrical signal applied to the conductive layer 68 conducts to the n-type layer 56.

One or more layers of the surfaces of the active structure 52 can also be textured using different methods such as known etching or grinding methods. In conventional LED fabrication processes, the street and texturing can take place in separate fabrication steps. In embodiments according to the present invention, the street and texturing processes can take place in the same step, simplifying the overall fabrication process.

In one embodiment according to the present invention, the backside processing can comprise forming a first backside passivation layer 86 on the top surface of the n-type layer. Portions of the first back side passivation layer can then be formed an array of features that help define the texturing pattern in the n-type layer 56. In some embodiments, the first passivation layer 86 can be etched to form a pattern such as an array of features (e.g. circles or dots), with the dots serving as a mask for etching to the textured features. The dots can be in a predefined pattern, which can result in textured features 87 (i.e. truncated cones) that are substantially the same size, or can be in a random pattern, which can result in textured features that vary in size.

In embodiments according to the present invention, the n-type layer 56 can be etched between the features of the patterned passivation layer 82, with some embodiments utilizing a wet chemical etch. This can cause etching along a crystal plane of the semiconductor layer comprising the n-type layer 56. As shown, this etching continues until the bottoms of each of the truncated cone features intersect with adjacent ones of the truncated cones. This will cause the etching to cease removing material from the n-type layer, with this intersecting being "self-limiting" on the depth of the features. This arrangement and method for forming the textured 87 features is fully described in U.S. patent application Ser. No. 13/868,361, to Donofrio and assigned to Cree, Inc., the contents of which are incorporated herein.

During the etching of the n-type layer 56 the first street 78 and the bond pad area 80 can also be etched. The textured features of the n-type layer are self-limiting and once the bottoms of the features intersect, the etching of these features stops, even if the etching material remains. This allows for additional etching time for further removal of epitaxial material in streets 78, 80 while not continuing to remove eptixial material at the textured features. This allows for one etch process step to be used to etch different features that require different etching time. By one feature being self-limiting, additional time can be used for etching one or more other features, such as the streets.

Following this etching process, a second back side passivation layer 88 can be included over the active structure 52 and over the streets 78, 80 between the active structures. The first and second back side passivation layers 86, 88 can comprise many different materials and in some embodiments can comprise the same material or different materials. The first back side passivation layer 86 serves primarily as a mask for forming the textured features, while the second back side passivation layer 88 serves primarily to protect the layers below it. Like the front side passivation layer 70 described above, the first and second back side passivation layers can comprise many different materials, such as a dielectric materials.

The opening can then be formed in the second passivation layer 88, along with the current spreading layer 58 and the dielectric reflective layer 60, to form the p-contact hole 84. The p-contact 80 is formed in the hole 84 and directly on the metal layer 62 for applying an electrical signal to the p-type layer 54 as described above. The formation of the openings is preferably by an etching process that provide a relatively clean surface on the metal layer 62 and the p-contact 82 should be formed with good sidewall coverage by the current spreading layer 58, dielectric reflective layer 60 and second passivation layer 84, to help prevent metal migration between the layers.

Figure 6:
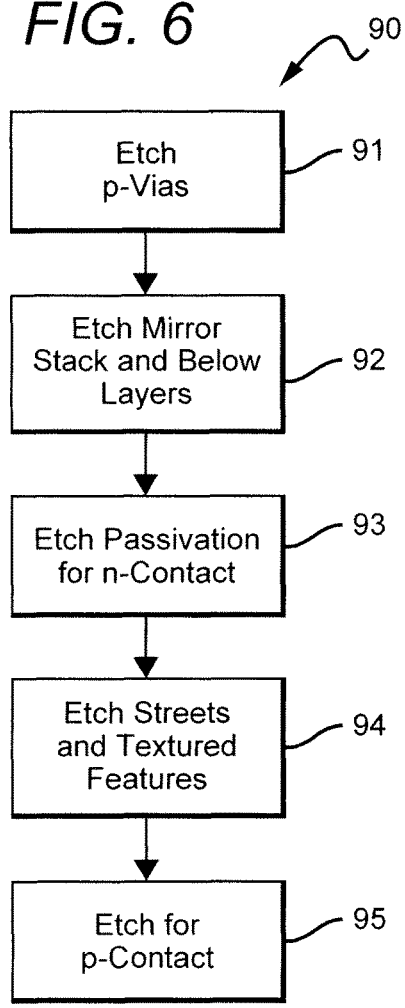
FIG. 6 is a flow-diagram showing steps in an LED chip fabrication process according to the present invention.

The LED chip 50 presents a simplified structure that can be fabricated using fewer steps than are used in fabrication of conventional LED chips. FIG. 6 is a flow diagram 90 showing some of the steps used in one embodiment of a fabrication process according to the present invention, with different steps focusing primarily on etching processes. In step one 91 the p reflective layer holes (or p vias holes) 64 can be etched through the dielectric layer 60 to the current spreading layer 58. The holes 64 can be filled when the metal layer is deposited and the metal layer material can form vias 66 to the current spreading layer 58.

Following deposition of the mirror stack 62, in step two 92, the mirror stack 62, dielectric reflective layer 60 and the current spreading layer and part of the p-type GaN epitaxial material 54 can be etched to form a via hole. As mentioned above, the layers that are etched are "self-aligned" and are etched in a single step. In some conventional LED chips, these layers can be etched in different steps that can result in a more complicated fabrication process.

Following deposition of the passivation layer 70, in step three 93, the passivation layer 70 can be etched to form passivation layer hole 72 that passes to the n-type layer 56. The conductive via layer 74 fills the passivation layer hole and forms a contact to the n-type layer 56.

The first backside passivation layer 86 can be deposited and then formed in to the pattern of features that control formation of the epitaxial materials textured features. In step four 94, the first street 78, the bond pad area 80 and textured features 87 can be formed in the same etching step. As described above, the etching of the textured features 87 can be self-limiting, which causes etching of the textured features 87 to stop while the additional texturing of the streets 78, 80 continues. This self-limiting of the textured features allows for etching of the textured features 87 and streets 78, 80 in one etching step.

The second backside passivation layer 88 can then be deposited. In step five 95 the p-contact hole 84 can be etched through the second backside passivation layer 88, the current spreading layer 58, and the dielectric reflective layer 60, to the mirror stack 62. The p-contact 82 can then be deposited in the hole 84 and in contact with the mirror stack 62. By having the mirror stack extend out past the mesa, instead of a light absorbing barrier as in some conventional LED chips, light absorption can be reduced.

Figure 7:
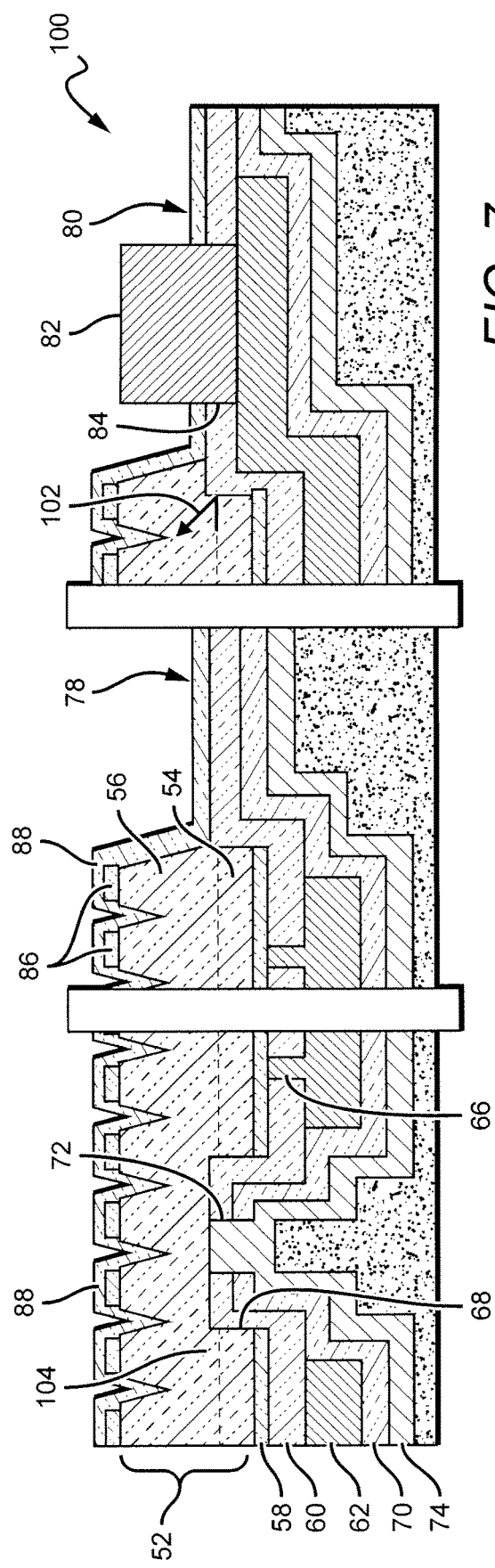
FIG. 7 is a sectional view of another embodiment of an LED chip according to the present invention.

LED chips according to the present invention can be arranged in many different ways and can comprise many different layer structures fabricated using different processes. FIG. 7 shows another embodiment of an LED chip 100 that is similar to the LED chip 50 shown in FIGS. 4 and 5 and described above. For the same or similar features or elements the same reference number above from the description of LED chip 50 is used herein with the understanding that the description above applies to this embodiment.

The LED chip 100 comprises an active structure 52, comprising a p-type layer 54 and an n-type layer 56, with an active region between the two. The front side of the LED chip 100 comprises a current spreading layer 58 on the p-type layer 54, and a dielectric reflective layer 60 on the current spreading layer 58, with adhesion layers included between additional layers as desired. A mirror stack 62 is included on the dielectric layer 60, with reflective layer vias 66 formed through the dielectric reflective layer 60 and passing from the mirror stack 62, to the current spreading layer 58.

Also on the front side of the LED chip 100, an n-type via hole 68 is formed through the dielectric reflective layer 60, current spreading layer 58, and p-type layer 54, to the n-type layer 56. The mirror stack 62 is offset from the hole, with the hole in the layers not formed in the self-aligned manner as described above. Furthermore, the dielectric reflective layer 60 is arranged differently than the dielectric reflective layer described above and extends on the inside of the via hole 68, over the surfaces of the p-type and n-type layers 54, 56 that are exposed in the via hole 68. The passivation layer hole 72 extends through the dielectric reflective layer 60 at the top of the via hole 68 to expose a surface of the n-type layer 56 for contacting by the via conductive layer 74. The dielectric reflective layer 60 can also extend into the first street 78 and the bond pad area 80. The front side passivation layer 70 extends into the first street 78 on the reflective layer 60.

This coverage of the dielectric reflective layer 60 provides for a reflective cup arrangement that help reflect sideways or lateral emitting or trapped light so that it can contribute to useful emission from the LED chip. This can include light that emits directly from the active region in a sideways direction or the light is trapped within the active structure by total internal reflection (TIR). As shown by first light path 102, light emitted along the active region toward the edge of the active structure 52 can be reflected by the upward extending portion of the dielectric reflective layer 60 at the active structure's edge. Similarly and as shown by second light path 104, light emitted toward the via can be reflected by the upward extending portion of the dielectric reflective layer 60 in the via hole 68. This reflective cup arrangement can provide for overall improved emission efficiency for the LED chip 100.

There are further differences in LED package 100. Unlike the LED package 50, the current spreading layer 58 does not extend into the first street 78 or the bond pad area 80. Instead, it stops at or near the edge of the active structure 52. Furthermore, the dielectric reflective layer 60 does not stop at the edge of the active structure 52 in the bond pad area 80, but instead continues up the edge surface of the current spreading layer 58, the edge of the p-type layer 54 and part of the edge of the n-type layer, and then extends into the bond pad area 80.

The LED package also comprises first and second backside passivation layers 86, 88, with the first passivation layer 86 arranged for formation of the pattern to dictate the shape and size of the n-type texture features as described above. Like above, the self-limiting etching of the textured features allows for the same etch step to be used for the formation of the texture features and the first street 78, and the bond pad area 80. The second backside passivation layer 88 is provided as protection over the texture features, first street 78 and bond pad area 80. A p-contact hole 84 can be formed in the bond pad area 80, through the second backside passivation layer 88 and the dielectric reflective layer 60, to expose the top surface of the mirror stack 62. A p-type contact 82 can be formed in the hole 84 and in contact with the mirror stack. Like above, an electrical signal applied to the p-type contact 82 spreads into the mirror stack 62, and is conducted through the vias 66 to the current spreading layer 58 where the signal spreads into the p-type layer 54. An electrical signal applied to the conductive layer 74 is conducted to the n-type layer 56 as described above.

For LED 100 the dielectric reflective layer 60 can terminate at different points after the active mesa etch. In some embodiments the dielectric reflective layer can extend beyond the edge of the n-GaN into the first street and the bond pad area 80 as shown, while in other embodiments it can terminate between the active mesa step and the edge of the n-GaN. In most embodiments it can be important for the dielectric reflective layer 60 to go past the active area step to form the reflective cup as described above. There can be other considerations regarding how far the layer extends such as the moisture permeability difference between $SiO_2$ and SiN, where it may be preferred not to have the $SiO_2$ be continuous across the street. Another SiN (backside passivation) layer is included that would cover the $SiO_2$ in the streets, but once singulated the edge of the $SiO_2$ could be exposed. If some of the $SiO_2$ of the dielectric reflective is removed in the street, then it would be encapsulated with SiN from both sides.

Figure 8:
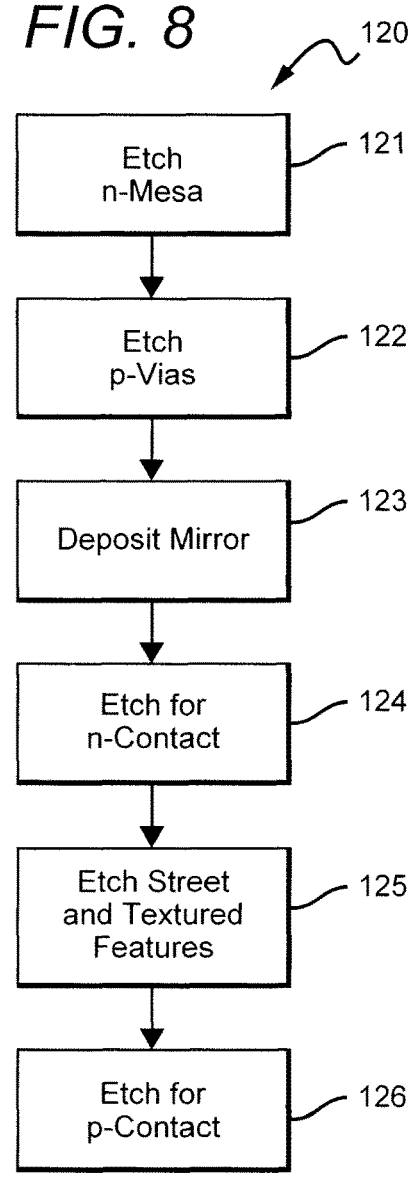
FIG. 8 is a flow-diagram showing steps in another LED chip fabrication process according to the present invention.

The LED chip 100 also presents a simplified structure that can be fabricated using fewer steps than are used in fabrication of conventional LED chips. The LED chip 100 has layers arranged as described above to provide for enhanced light extraction. FIG. 8 is a flow diagram 120 showing some of the steps used in one embodiment of a fabrication process according to the present invention, with different steps focusing primarily on etching processes. Following deposition of the current spreading layer 58, in step one 121 the n-mesa is etched through the current spreading layer 58, through the p-type layer 54 and to n-type layer 56.

The dielectric layer 60 can then be deposited on over the current spreading layer 58 and over the n-mesa. In some embodiments, the dielectric reflective layer 60 can form a cup as described above and can extend into one or both of the first street 78 and the bond pad area 80. In step two 122, dielectric layer holes 64 can be formed through the dielectric layer using known etching processes.

In step three 123, the mirror stack can be deposited on the dielectric reflective layer 60, filling the dielectric layer holes to form vias 66. The passivation layer 70 can then be deposited and in step four 124 the passivation layer can be etched to form the n-contact via hole 68. The conductive layer 74 can then be formed over the passivation layer and in contact with the n-type layer 56.

The first backside passivation layer 86 can then deposited and etched into its pattern of features. In step five 125, the textured features 87, first street 78 and the bond pad area 80 can be etched in the same step. As described above, the etching of the textured features 87 can be self-limiting, which allows for etching of the textured features and streets even though the street etching can take more time.

The second backside layer 88 can then be deposited and in step six 126 the second backside passivation layer 88, and the dielectric reflective layer 60 can be etched to the mirror stack 62 and the p-contact 82 can be deposited on the mirror stack 62.

It is understood that different embodiments can be layers arranged in many different ways beyond those shown in the embodiments above, and can cover different portions of adjacent layers. For example, in the embodiments above, the mirror stack 62 extends into the bond pad area 80 but does not extend beyond the edge of the active region 52 in the first street 78, and does not extend beyond the edge of the n-type via hole 68. However, in other embodiments these and other layers can cover different portions and can extend beyond the areas shown.

Figure 9:
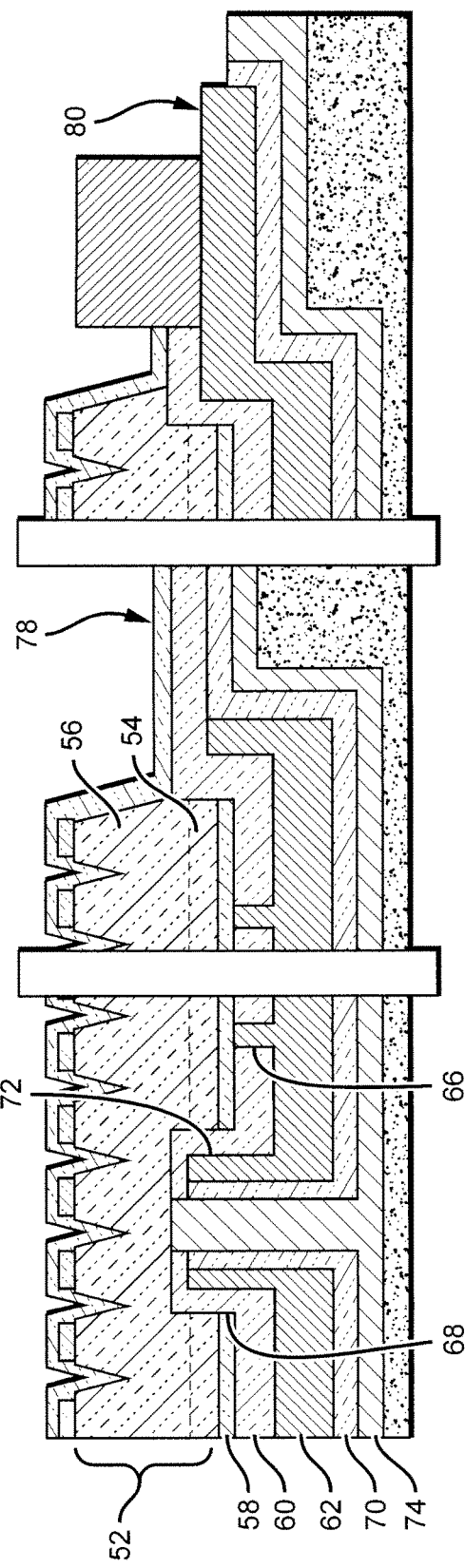
FIG. 9 is a sectional view of another embodiment of an LED chip according to the present invention.

FIG. 9 shows another embodiment of an LED chip 130 according to the present invention that is similar to the LED chip 100 shown in FIG. 6 and described above. The LED chip 130 comprises an active structure 52 having a p-type layer 54 and an n-type layer 56, with an active region between the two. The front side of the LED chip 130 comprises a current spreading layer 58 a dielectric reflective layer 60 on the current spreading layer 58, with adhesion layers included between additional layers as desired. A mirror stack 62 is included on the dielectric layer 60, with reflective layer vias 66 formed through the dielectric reflective layer 60 and passing from the mirror stack 62, to the current spreading layer 58.

As with the embodiments above, an n-type via hole 68 is formed through the dielectric reflective layer 60, current spreading layer 58, and p-type layer 54, to the n-type layer 56. Also similar to the embodiments above, the dielectric reflective layer 60 and the mirror stack 62 extend beyond the edge of the active structure 52 in the bond pad area 80 and the dielectric reflective layer extends into the first street 78. However, in this embodiment, the metal stack 62 can extend beyond the edge of the active structure 52 on the dielectric reflective layer 60 and at least partially into the first street 78. The metal stack 62 can also extend with the dielectric layer beyond the edge of the active structure and also to at least partially cover the inner surface of the n-type via hole 68. It is understood that in some embodiments the metal stack 62 should not extend to the n-type GaN layer 56 and should not extend to the edge of the street 80. The mirror stack 62 also should not extend in the n-type via holes to completely cover the dielectric reflective layer 60 in the n-type via holes 68. This allows for efficient and reliable singulation of the devices and allows for etching of the passivation layer hole 72 without contacting the metal stack 62 when depositing the conductive layer 74 on the passivation layer 70.

This arrangement can provide advantages such as a more efficient cup like reflector that in the embodiment described above. Both the dielectric layer 60 and the metal stack 62 can contribute to the reflection of light that emits directly from the active region in a sideways direction or light that is trapped within the active structure by total internal reflection (TIR). It is also understood that the metal stack can extend as described herein in embodiments not having the reflect cup arrangement, such as in the embodiment described herein.

GaN texturing using SiN dots formed from the first backside passivation layer and a self-limiting crystallographic wet etch is described above. Some crystallographic etch is known to etch rapidly through n-GaN but is slow through p-GaN. The LED chip 100 can have on advantage in that the p-GaN has been removed during front side processing (at the n-mesa etch), so the backside etch completes within a relatively short time. For the some prior art devices as well as LED chip 50, the backside etch needs to go through p-GaN, and the etch can consequently take longer and sometimes leaves p-GaN residue that can lower process yield.

Referring again to the LED chip 50 shown in FIGS. 4 and 5 and described above, the self-aligned mirror stack 62, dielectric reflective layer 60, current spreading layer (ITO), p-type layer and part of n-type layer (GaN), the hole through these layers can be etched by reactive ion etch (RIE) processes, while it is preferred to wet etch Ag mirror stack due to known difficulties performing a clean dry etch of Ag. If an adhesion layer is included and depending on the choice of the adhesion layer, it may be wet or dry etched. The Ag mirror stack wet etch will etch Ag laterally as well as vertically, resulting in an undercut. If the adhesion layer is a light absorbing metal, the Ag undercut can create an absorbing edge around the Ag periphery, as seen from the dielectric layer side. This is undesirable since it can affect light extraction negatively. It is also undesirable to have an overhanging adhesion layer when depositing the passivation layer over the top because the overhang can prevent conformal coating, leaving gaps in the passivation that can negatively impact reliability.

Figure 10:
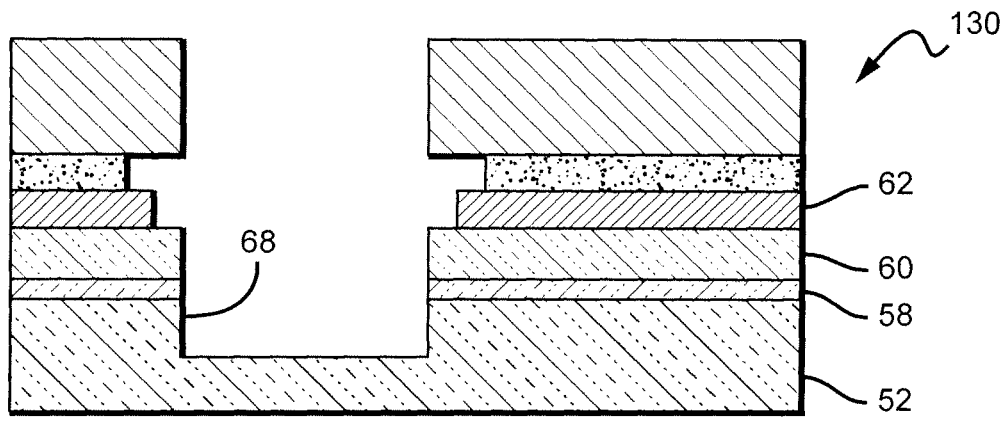
FIG. 10 is a sectional view of layers in an LED chip according to the present invention.

Referring now to FIG. 10, to address this issue the present invention provides a process whereby a second wet etch is performed after completing the etch of the Ag mirror stack 62, with the second etch comprising a chemical that etches the adhesion layer 130 but not the Ag mirror stack 62. When this etching process is timed properly, the second etch causes the adhesion layer 130 to etch laterally beyond the mirror stack 62, thus eliminating the absorbing edge around the mirror stack 62. This process also leaves the dielectric reflective layer 60 and current spreading layer 58 aligned in the via hole 68. Many different wet etches can be used to etch Ag, such as commercially available Silver Etchant TFS, Seiver Ethcant 9044 (both from Transese Company, Inc.), and commercially available nitric acid (concentrated or diluted). One example of an adhesion layer material can comprise Ti, which is compatible with Ag. In some embodiments, the Ti layer can be etched with HCl (concentrated or diluted in water).

For the build structures according to the present invention and as described above with the embodiments shown in FIGS. 4 and 6, the p-contact 82 can be on and connected to the mirror stack 62, with some embodiments having a p-contact on the Ag-side of mirror stack. Before the p-contact 82 is formed, a hole must be formed through as many as three layers or more. In some embodiments these layers can include the second backside passivation layer 88, the current spreading layer (ITO) 58 and the dielectric layer 60. Typical RIE chemistries for etching dielectrics can tarnish exposed Ag, which may result in a poor electrical contact or inconsistent visual appearance that interferes with automated visual inspection tools. One solution to the problem is to remove the tarnish with immersion into a chemical or by exposing the tarnished surface to a plasma clean, such as N2 plasma.

Figure 11:
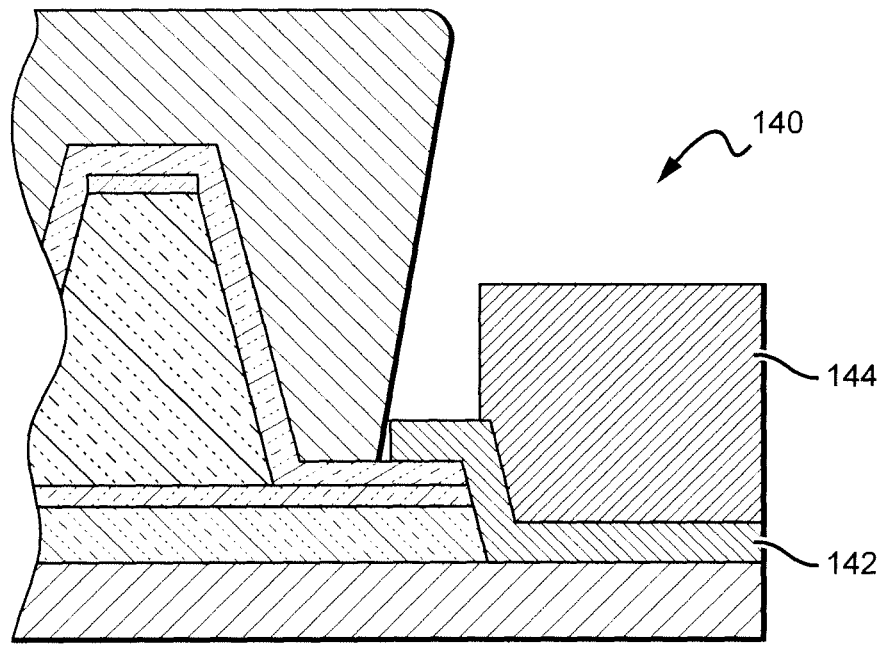
FIG. 11 is a sectional view of other layers in an LED chip according to the present invention.

In some embodiments according to the present invention, when depositing the p-contact 82, the exposed mirror stack (Ag) should be encapsulated to prevent metal (Ag) migration during operation. All exposed surfaces of the metal (Ag) should be sealed in during p-contact deposition. There are two elements to this. First, there should be no polymer or impurity deposition on the sidewalls during the RIE etch preceding the p-contact deposition. Second, the p-contact should comprise metals known to be good barrier metals and the deposition of the metals should cover the sidewalls as well as the bottom of the p-contact hole. Examples of suitable RIE etch chemistries include $CF_4/O_2$ and $SF_6/O_2$. Referring now to FIG. 11 shows on embodiment p-contact structure 140 that can comprise more than one material, with the p-contact 140 comprising a barrier layer 142 of one material and a bulk material 144 of another. Examples of suitable materials comprise p-contact barrier layer 142 materials include but is not limited to sputtered Ti/Pt, followed by a bulk material comprising 144 comprising evaporated Au. Other embodiments can comprise a barrier layer 142 of sputtered Ti/Ni and a bulk material 144 of evaporated Ti/Au. Still other embodiments can comprise different combinations of these materials.

With references again to the embodiments shown in FIGS. 4 and 6, as the structures go through a wafer bonding process there is potential to have voids in the bond layer if the structure topology is too large. For example, the voids under the vias hole 68 or the first street 78 can be too large and result in voids in the bond layer. A solution to this problem can be to planarize the structure prior to wafer bonding. This can be achieved by including a polymer or spin-on-glass on the wafer. FIG. 12 shows an embodiment of an LED chip 160 that is similar to the LED chip 50 shown in FIG. 5 and described above. In this embodiment, a polymer 162 can be included in the voids with the polymer 162 spin-coated, cured, and etched back in the planar regions, just prior to depositing on the bond layer 164. Alternatively, the planarization can be performed between the passivation and the Al layer, between the mirror stack and the passivation, or the planarization polymer can replace passivation. In these embodiments, the polymer can be left intact after cure, or it can be etched back in the planar regions leaving polymer only at step edges.

FIG. 13 shows another embodiment of an LED chip 150 according to the present invention with a further simplified build. The LED chip 170 can comprise layers and structures similar to LED chip 50 including, but not limited to, the active structure 52, and front side layers such as the current spreading layer 58, mirror stack 62, passivation layer 70, conductive layer 74 and bond layer 76. The backside can also comprise the first street 78, bond pad area 80, p-contact 82, first and second backside passivation layers 86, 88 and textured features 87. The LED chip 170, however, is simplified by removing the dielectric reflective layer and eliminating the step of forming vias through the reflective layer. This can result in a simplified build process comprising fewer steps, with some embodiments having been fabricated in as little as a 4-step or 4-level build. In some embodiments, removing the reflective layer may result in some reduction in emission efficiency by removal of the dielectric reflective layer, but in some applications these losses may be acceptable.

In still other embodiments the street and texture features can be etched in two different etching steps as in prior art devices. This can, however, add an additional step to the fabrication process for LED chip and LED chip 100. In still other embodiments the current spreading layer can be removed, in which case the mirror stack can be directly in contact with p-GaN and can be used for spreading current from the p-contact instead of the current spreading layer.

Although the present invention has been described in detail with reference to certain preferred configurations thereof, other versions are possible. Therefore, the spirit and scope of the invention should not be limited to the versions described above.

We claim:

1. A light emitting diode (LED) chip, comprising:
an active LED structure comprising an active region between two oppositely doped layers, said active region emitting light in response to an electrical signal applied to at least one of said oppositely doped layers;
a first reflective layer on one of said oppositely doped layers;
a second reflective layer, said first reflective layer between said active region and said second reflective layer said second reflective layer reflecting light not reflected by said first reflective layer, wherein said second reflective layer extends beyond an outer edge of said active LED structure and into a street, said street outside of said active region, wherein said first and second reflective layers are spaced away from said active LED structure such that neither of said first and second reflective layers directly contacts said active LED structure; and
a contact in said street and on a portion of said second reflective layer that extends beyond said outer edge of said active LED structure and into said street, wherein said contact extends through said first reflective layer and contacts a top of said portion of said second reflective layer.

2. The LED chip of claim 1, wherein the first reflective layer extends beyond the outer edge of said active LED structure.

3. The LED chip of claim 2, wherein said contact extends to said portion of said second reflective layer by extending through a portion of said first reflective layer that extends beyond said outer edge of said active LED structure and into said street.

4. The LED chip of claim 1, wherein said first reflective layer comprises a dielectric material.

5. The LED chip of claim 1, wherein said first reflective layer comprises one or more of $SiO_2$, SiN, Si, Ge, MgOx, MgNx, ZnO, SiNx, SiOx, AlN and alloys or combinations thereof.

6. The LED chip of claim 1, wherein said second reflective layer comprises a conductive metal.

7. The LED chip of claim 1, wherein said second reflective layer comprises a conductive metal stack.

8. The LED chip of claim 1, further comprising a current spreading layer between said first reflective layer and said active LED structure.

9. The LED chip of claim 1, wherein said contact is a p-contact.

10. The LED chip of claim 9, wherein said p-contact is in a hole through said first reflective layer.

11. The LED chip of claim 1, wherein said contact is in a hole through said first reflective layer.

12. The LED chip of claim 1, wherein said first reflective layer terminates before an end of said LED chip.

13. The LED chip of claim 1, wherein said first reflective layer terminates at an end of said LED chip.

14. The LED chip of claim 1, said active LED structure comprising an n-type layer and a p-type layer, wherein said first reflective layer terminates between an edge of said p-type layer and an edge of said n-type layer.

15. The LED chip of claim 1, wherein said first reflective layer forms a reflective cup.

16. The LED chip of claim 15, wherein said reflective cup comprises an upward extending portion that reflects light emitted laterally in said active LED structure.

17. The LED chip of claim 1, comprising a self-aligned via hole through said first and second reflective layers to said active LED structure.

18. The LED chip of claim 1, further comprising textured features on said active LED structure.

19. The LED chip of claim 18, wherein said textured features are self-limiting to an etch.

20. A light emitting diode (LED) chip, comprising:
an active LED structure comprising an active region between two oppositely doped layers, said active region emitting light in response to an electrical signal applied to at least one of said oppositely doped layers, said active LED structure comprising an n-type layer;
a current spreading layer on said active LED structure;
a dielectric reflective layer on said current spreading layer;
a metal reflective layer on said dielectric reflective layer, said dielectric reflective layer between said current spreading layer and said metal reflective layer; and
wherein said dielectric reflective layer and said metal reflective layer are separated from said active LED structure;
wherein said current spreading layer, said dielectric reflective layer, and said metal reflective layer extend beyond an outer edge of said active region and into a street, said street outside of said active region; and
a contact in said street, said contact extending through said current spreading layer and said dielectric reflective layer to said metal reflective layer so as to contact said metal reflective layer.

21. The LED chip of claim 20, wherein said dielectric reflective layer extends beyond an edge of said n-type layer.

22. The LED chip of claim 20, wherein said dielectric reflective layer terminates before an edge of said LED chip.

23. The LED chip of claim 20, wherein said dielectric reflective layer terminates at an edge of said LED chip.

24. The LED chip of claim 20, wherein said current spreading layer and said metal reflective layer are connected by one or more metal vias.

25. The LED chip of claim 20, wherein said contact extends through said current spreading layer and said dielectric reflective layer to a portion of said metal reflective layer that is in said street.

26. The LED chip of claim 25, wherein said contact is a p-contact.

27. The LED chip of claim 20, wherein said contact extends through a portion of said current spreading layer in said street and a portion of said dielectric reflective layer in said street to a portion of said metal reflective layer in said street.

28. The LED chip of claim 20, comprising a self-aligned via hole through said dielectric and metal reflective layers to said active LED structure.

29. The LED chip of claim 20, further comprising self-limiting textured features on said active LED structure.

30. A light emitting diode (LED) chip, comprising:
an active region;
a first reflective layer on said active region; and
a second reflective layer on said first reflective layer such that said first reflective layer is between said active region and said second reflective layer, said second reflective layer reflecting light not reflected by said first reflective layer, wherein said first reflective layer and said second reflective layer extend beyond an outer edge of the active region on a portion of the LED chip and into a street, said street outside of said active region, wherein said second reflective layer is a metal reflective layer; and
a contact in said street and extending through said first reflective layer to contact said second reflective layer.

31. The LED chip of claim 30, wherein said second reflective layer extends beyond said active region on substantially all of the LED chip.

32. The LED chip of claim 30, further comprising a contact on a portion of said second reflective layer that is in said street.

33. The LED chip of claim 32, wherein said contact passes through a portion of said first reflective layer that is in said street.

34. The LED chip of claim 30, wherein said first reflective layer overlaps all of said active region in a vertical direction.

35. A light emitting diode (LED) chip, comprising:
an active LED structure comprising an active region;
a plurality of layers on a backside of said active LED structure, said plurality of layers comprising a first reflective layer and a second reflective layer, said first reflective layer and said second reflective layer extending into a street, said street outside of said active region;
a contact in said street, through a portion of first reflective layer that is in said street, and contacting a portion of said second reflective layer that is in said street; and
a via hole on the backside of and into said active LED structure, wherein at least two of said plurality of layers are self-aligned at said via hole;
wherein said first and second reflective layers are spaced away from said active LED structure such that neither of said first and second reflective layers directly contacts said active LED structure.

36. The LED chip of claim 35, wherein said plurality of layers further comprises a current spreading layer, said current spreading layer and said first reflective layer self-aligned at said via hole.

37. The LED chip of claim 36, wherein said first reflective layer comprises a dielectric material.

38. The LED chip of claim 35, wherein said second reflective layer is self-aligned at said via hole.

39. The LED chip of claim 37, wherein said second reflective layer comprises a metal.

40. A light emitting diode (LED) chip, comprising:

an active LED structure comprising an active region;

a plurality of layers on a backside of said active LED structure, said plurality of layers comprising a dielectric reflective layer and a metal reflective layer, said dielectric reflective layer extending into a street, said street outside of said active region; and wherein two or more of said plurality of layers are self-aligned in said street and on said backside of said active LED structure, wherein the self-alignment forms a hole through said first reflective layer, and further comprising a contact in said hole and contacting said second reflective layer; and wherein said dielectric reflective layer and said metal reflective layer are separated from said active LED structure.

41. The LED chip of claim 40, further comprising a via hole, wherein a first of said plurality of layers is self-aligned at said via hole and at an edge of said active LED structure.

42. The LED chip of claim 41, wherein said plurality of layers further comprises a current spreading layer, and wherein said first of said plurality of layers is said current spreading layer.

43. The LED chip of claim 41, wherein a second of said plurality of layers is self-aligned at said via hole and at said edge of said active LED structure.

44. The LED chip of claim 43, wherein said second of said plurality of layers is said dielectric reflective layer.

45. The LED chip of claim 43, wherein a third of said plurality of layers is self-aligned at said via hole and at said edge of said active LED structure.

46. The LED chip of claim 45, wherein said third of said plurality of layers is said metal reflective layer.

47. The LED chip of claim 40, wherein said two or more of said plurality of layers are vertically self-aligned.

48. The LED chip of claim 40, wherein said two or more of said plurality of layers are self-aligned at more than one location.

* * * * *